US012550420B2

(12) United States Patent
Fan et al.

(10) Patent No.: US 12,550,420 B2
(45) Date of Patent: Feb. 10, 2026

(54) TOP CONTACT STRUCTURES FOR STACKED TRANSISTORS

(71) Applicant: INTERNATIONAL BUSINESS MACHINES CORPORATION, Armonk, NY (US)

(72) Inventors: Su Chen Fan, Cohoes, NY (US); Dominik Metzler, Clifton Park, NY (US); Hemanth Jagannathan, Niskayuna, NY (US); Jing Guo, Fremont, CA (US); Jay William Strane, Warwick, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 740 days.

(21) Appl. No.: 17/805,039

(22) Filed: Jun. 2, 2022

(65) Prior Publication Data

US 2023/0395596 A1    Dec. 7, 2023

(51) Int. Cl.
| | | |
|---|---|---|
| *H10D 84/83* | (2025.01) | |
| *H01L 23/522* | (2006.01) | |
| *H01L 23/532* | (2006.01) | |
| *H10D 86/40* | (2025.01) | |
| *H10D 86/60* | (2025.01) | |

(52) U.S. Cl.
CPC ......... *H10D 84/83* (2025.01); *H01L 23/5226* (2013.01); *H01L 23/5329* (2013.01); *H10D 86/441* (2025.01); *H10D 86/451* (2025.01); *H10D 86/60* (2025.01)

(58) Field of Classification Search
CPC .... H10D 86/441; H10D 86/451; H10D 86/60; H10D 30/43; H10D 30/6735; H10D 30/6757; H10D 62/121; H10D 84/0149; H10D 88/00; H10D 30/014; H10D 64/017; H10D 84/0128; H10D 84/0151; H10D 84/0167; H10D 84/0186; H10D 84/85; H10D 84/038; H10D 88/01
See application file for complete search history.

(56) References Cited

U.S. PATENT DOCUMENTS

| | | | |
|---|---|---|---|
| 9,472,558 | B1 | 10/2016 | Cheng |
| 9,659,963 | B2 | 5/2017 | Cheng |
| 9,837,414 | B1 | 12/2017 | Balakrishnan |
| 10,192,867 | B1 | 1/2019 | Frougier |
| 10,388,519 | B2 | 8/2019 | Smith |
| 10,770,479 | B2 | 9/2020 | Smith |
| 2020/0075574 | A1 | 3/2020 | Smith |
| 2021/0118798 | A1 | 4/2021 | Liebmann |
| 2023/0062940 | A1* | 3/2023 | Khaderbad .......... H10D 84/853 |

* cited by examiner

*Primary Examiner* — Fernando L Toledo
*Assistant Examiner* — Adam S Bowen
(74) *Attorney, Agent, or Firm* — L. Jeffrey Kelly

(57) ABSTRACT

A semiconductor structure including a dielectric isolation region between and electrical isolating a first top contact of a first stacked transistor from a second top contact of a second stacked transistor, where at least one vertical surface of the first top contact is substantially flush with at least one vertical surface of the isolation region, and where at least one vertical surface of the second top contact is substantially flush with the at least one vertical surface of the isolation region.

19 Claims, 21 Drawing Sheets

SECTION X₁-X₁

SECTION X₂-X₂

SECTION Y-Y

SECTION X₁-X₁

SECTION $X_2$-$X_2$

SECTION Y-Y

SECTION X₁-X₁

SECTION X₂-X₂

SECTION Y-Y

SECTION X₁-X₁

SECTION X₂-X₂

SECTION Y-Y

SECTION X₁-X₁

SECTION $X_2$-$X_2$

SECTION Y-Y

SECTION X₁-X₁

SECTION X₂-X₂

SECTION Y-Y

SECTION Y-Y

SECTION Y-Y

TOP CONTACT STRUCTURES FOR STACKED TRANSISTORS

BACKGROUND

The present invention generally relates to semiconductor structures, and more particularly to stacked transistor structures having top contacts separated by a dielectric isolation region.

Integrated circuit (IC) chips are formed on semiconductor wafers at increasingly smaller scale. In current technology nodes, such as 7, 10 and 14 nanometer technologies, transistor devices are constructed as three-dimensional (3D) fin field effect transistor (FINFET) structures. However, chipmakers face a myriad of challenges at 5 nm, 3 nm and beyond. Currently, traditional chip scaling continues to slow as process complexities and costs escalate at each node.

A potential solution to this chip scaling problem is gate-all-around technology. One example of a complex gate-all-around technology is a complementary FET (CFET) where nFET and pFET nanowires/nanosheets are vertically stacked on top of each other.

SUMMARY

According to an embodiment of the present invention, a semiconductor structure is provided. The semiconductor structure may include a dielectric isolation region between and electrical isolating a first top contact of a first stacked transistor from a second top contact of a second stacked transistor, where at least one vertical surface of the first top contact is substantially flush with at least one vertical surface of the isolation region, and where at least one vertical surface of the second top contact is substantially flush with the at least one vertical surface of the isolation region.

According to another embodiment of the present invention, a semiconductor structure is provided. The semiconductor structure may include a dielectric isolation region between and electrical isolating a first top contact of a first stacked transistor from a second top contact of a second stacked transistor, a first via above and contacting the first top contact, where a vertical surface of the first top contact is substantially flush with a vertical surface of the first via, and a second via above and contacting the second top contact, where a vertical surface of the second top contact is substantially flush with a vertical surface of the second via.

According to another embodiment of the present invention, a semiconductor structure is provided. The semiconductor structure may include a via above and contacting a top contact of a stacked transistor, where a sidewall of the via is substantially flush with a sidewall of the top contact; and a dielectric isolation region adjacent to and contacting the top contact and the via, where a sidewall of the dielectric isolation region is substantially flush with the sidewall of the via and the sidewall of the top contact.

BRIEF DESCRIPTION OF THE DRAWINGS

The following detailed description, given by way of example and not intended to limit the invention solely thereto, will best be appreciated in conjunction with the accompanying drawings, in which.

Figure 1:
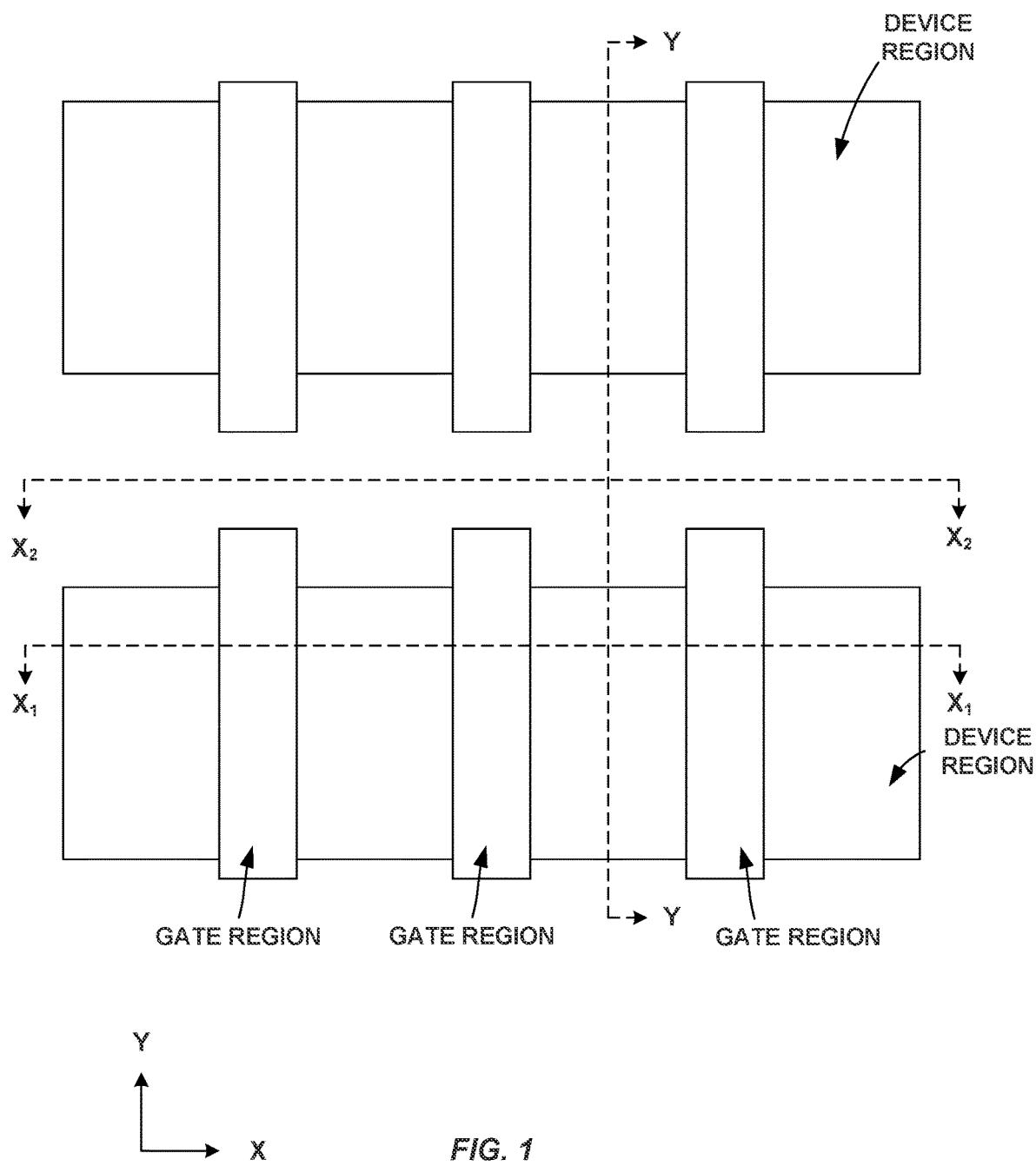
FIG. 1, a top view of a generic structure is shown to provide spatial context to the different cross-sectional views and structural orientations of the semiconductor structures shown in the subsequent figures.

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Complementary field effect transistors, or stacked transistors, have known advantages over conventional transistor structures in terms of density, performance, power consumption, and integration. However, fabricating top contacts for top devices of a stacked transistor has become increasingly difficult as device spacing continues to shrink with the advent of smaller technology nodes. More specifically, for example, it is particularly challenging to form individual top contacts and corresponding back-end-of-line connections for stacked devices with small cell height and small back-end-of-line pitch without the risk of shorting. For example, with sub-20 nm back-end-of-line pitch the tip-to-tip spacing between adjacent interconnect structures gets unreasonably small and the risk of shorting or failure significantly increases.

The present invention generally relates to semiconductor structures, and more particularly to stacked transistor structures having top contacts separated by a dielectric isolation region. More specifically, the stacked transistor structures and associated methods disclosed herein enable a novel solution for providing individual top contacts and corresponding interconnect structures for adjacent stacked transistor devices spaced very close to one another. Exemplary embodiments of stacked transistors having top contacts separated by a dielectric isolation region are described in detail below by referring to the accompanying drawings in FIGS. 1 to 21. Those skilled in the art will readily appreciate that the detailed description given herein with respect to these figures is for explanatory purposes as the invention extends beyond these limited embodiments.

Referring now to FIG. 1, a top view of a generic structure is shown to provide spatial context to the different cross-sectional views and structural orientations of the semiconductor structures shown in the figures and described below. Additionally, XYZ Cartesian coordinates may be also shown in each of the drawings to provide additional spatial context. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings. The generic structure illustrated in FIG. 1 shows gate regions generally oriented perpendicular to device regions. FIGS. 2-21 represent cross section views taken along lines $X_1$-$X_1$, $X_2$-$X_2$, Y-Y as labeled in each.

Figure 2:
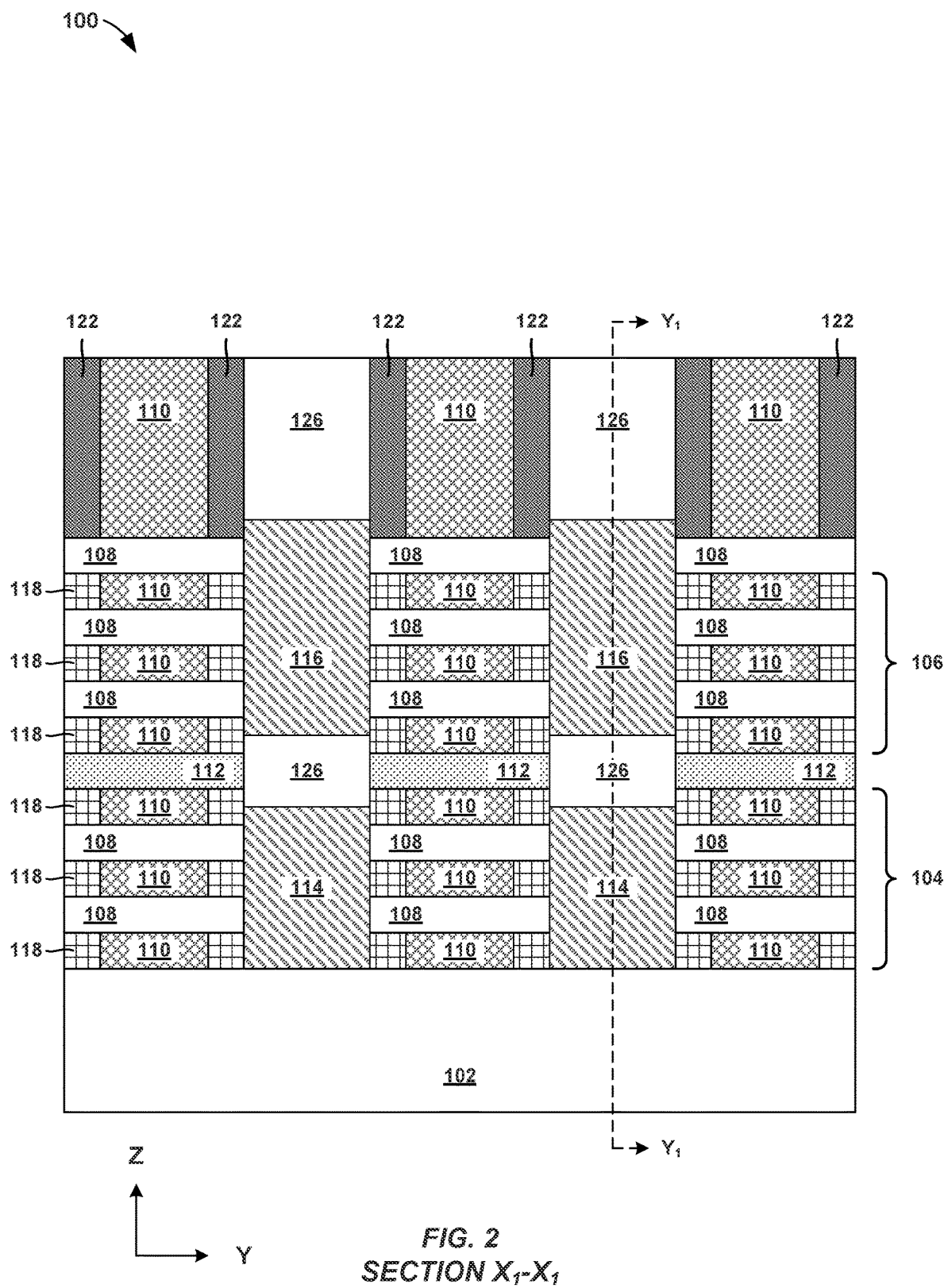
FIGS. 2, 3, and 4, are cross-sectional views of the semiconductor structure depicted in FIG. 1 during an intermediate step of a method of fabricating a stacked transistor structure according to an exemplary embodiment.
Figure 3:
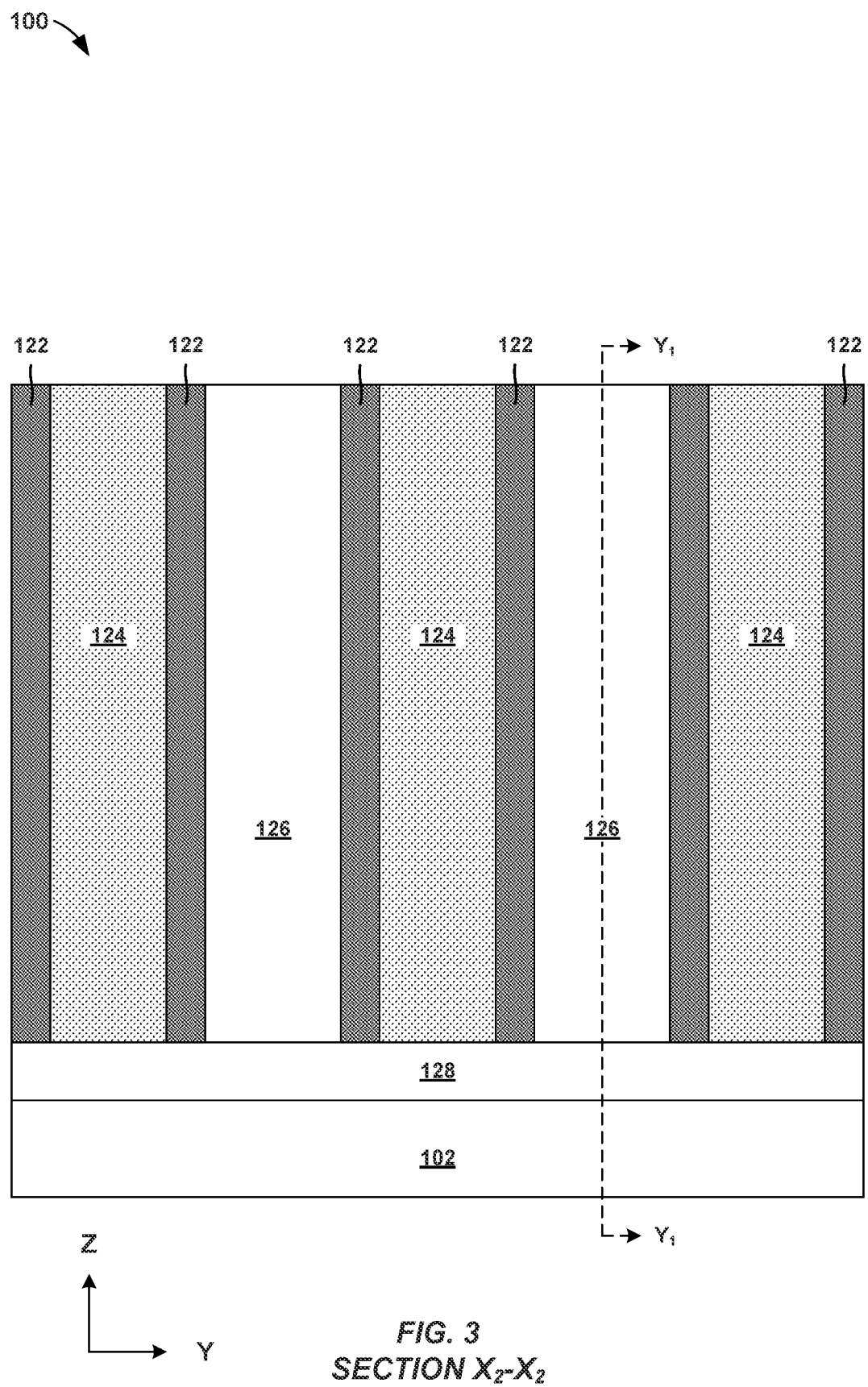
Figure 4:
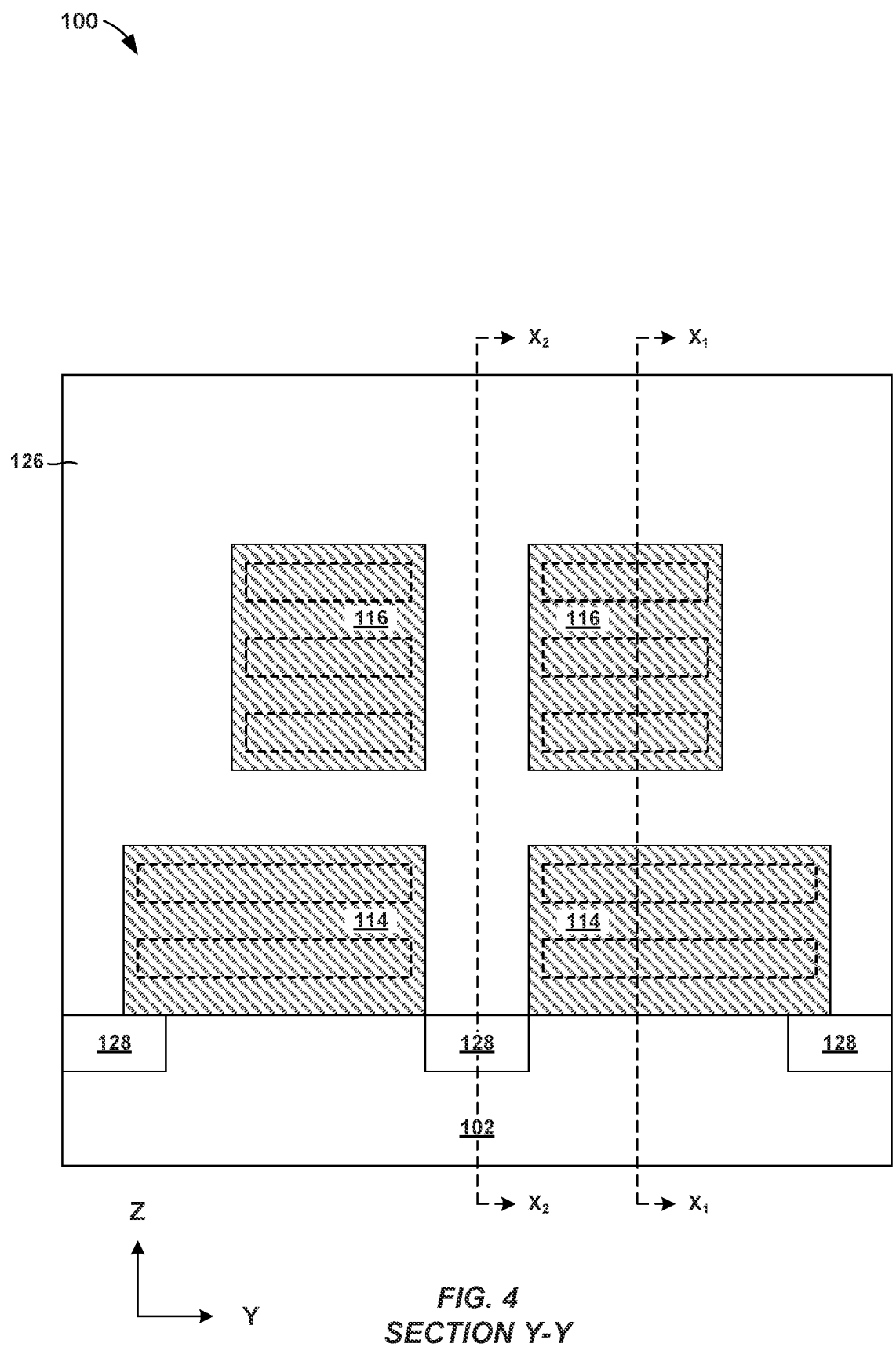

Referring now to FIGS. 2, 3 and 4, a structure 100 is shown during an intermediate step of a method of fabricating a stacked transistor structure according to an embodiment of the invention.

The structure 100 illustrated in FIGS. 2-4 includes an array of stacked transistors formed on a substrate 102 in accordance with known techniques. As illustrated, the array of stacked transistors includes bottom nanosheet stacks 104 and top nanosheet stacks 106 each including silicon channels 108 surrounded by a gate 110, also known as a high-k metal gate (HKMG). The bottom nanosheet stacks 104 are separated from the top nanosheet stacks 106 by a stack isolation layer 112 which is patterned from a sacrificial material (e.g. SiGe with high concentration of Ge) at the same time as the silicon channels 108 of the bottom nanosheet stacks 104 and subsequently replaced with a dielectric material. The bottom nanosheet stacks 104 are laterally wider than the top nanosheet stacks 106, as illustrated with dashed lines in FIG. 4. In other words, the bottom nanosheet stacks 104 are longer than the top nanosheet stacks 106 when measured in a direction parallel with the gate 110, or in the in the y-direction. In general, and as illustrated in FIG. 4 the one side of both stacks may be generally aligned; however, such is not required. In a non-limiting exemplary embodiment, the width of the top nanosheet stacks 106 can range from approximately 15 nm to approximately 80 nm, and the width of the bottom nanosheet stacks 104 can be approximately 20 nm to approximately 40 nm longer than the width of the top nanosheet stacks 106. In at least one embodiment, the bottom nanosheet stacks 104 and the top nanosheet stacks 106 are all patterned together and have a width, in the y-direction, of the bottom nanosheet stacks 104, followed by additional patterning and recessing techniques to cut or trim the top nanosheet stacks 106, as illustrated.

Additionally, bottom source drain regions 114 and top source drain regions 116 are formed between adjacent stacks (104, 106) in direct contact with exposed ends of the silicon channels 108. More specifically, the bottom source drain regions 114 and the top source drain regions 116 are epitaxially grown from the exposed ends of the silicon channels 108 according to known techniques.

The structure 100 further includes inner spacers 118 between alternate channels (108). The inner spacers 118 laterally separate the gate 110 from both the bottom source drain regions 114 and the top source drain regions 116, respectively, as illustrated. The inner spacers 118 provide necessary electrical insulation between the gate 110 and the source drain regions (114, 116).

When forming the dummy gate, later replaced by the gate 110, top gate spacers 122 are added to separate and electrically insulate the gate 110 from subsequently formed structures, such as, for example, contact structures. The top gate spacers 122 are critical for electrically insulating the gate 110 from any subsequently formed source drain regions (for example the top source drain region 116) or contact structures. In at least one embodiment, the top gate spacers 122 include silicon nitride, silicon boron nitride, silicon carbon nitride, silicon boron carbon nitride, or other known equivalents.

Although the stack isolation layer 112 is shown as a separate component from the top gate spacers 122, they may, in some embodiments, be made from identical dielectric materials and thus be indistinguishable from one another in the final structure. For example, both the stack isolation layer 112 and the top gate spacers 122 can be made from any of the dielectric materials listed above with respect to the top gate spacers 122. In another example, the stack isolation layer 112 and the top gate spacers 122 can be made different materials.

Finally, the existing components are substantially surrounded by a dielectric layer 126, such as known interlevel dielectrics, and adjacent transistors can be electrically insulated from one another with conventional shallow trench isolation features 128. In at least one embodiment, the dielectric layer 126 may include silicon oxide. Alternatively, the dielectric layer 126 may include some combination of materials, for example a silicon nitride dielectric liner and a silicon oxide fill.

Additionally, a gate cut dielectric 124 is present between, and separates, adjacent gates 110 from one another. The gate cut dielectric 124 may include any suitable dielectric materials, such as, for example, SiO, SiN, SiC, SiCO, SiBCN, SiOCN or any combination of those materials.

Although only a limited number of transistors, components, or structures are shown, embodiments of the present invention shall not be limited by any quantity otherwise illustrated or discussed herein.

Figure 5:
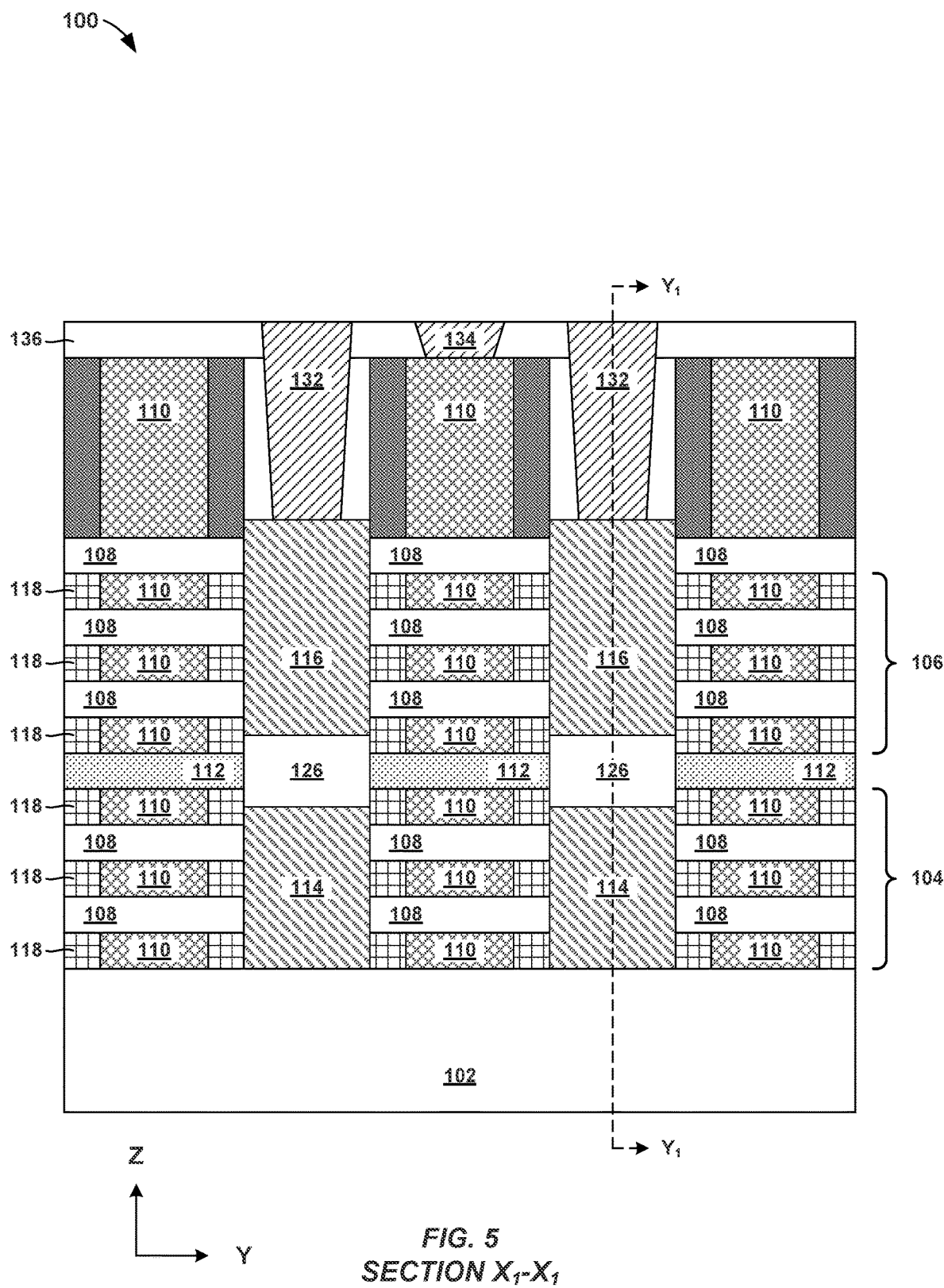
FIGS. 5, 6, and 7 are cross-sectional views of the structure after forming bottom source drain contacts, top source drain contacts, and gate contacts in a middle-of-line dielectric layer according to an exemplary embodiment.
Figure 6:
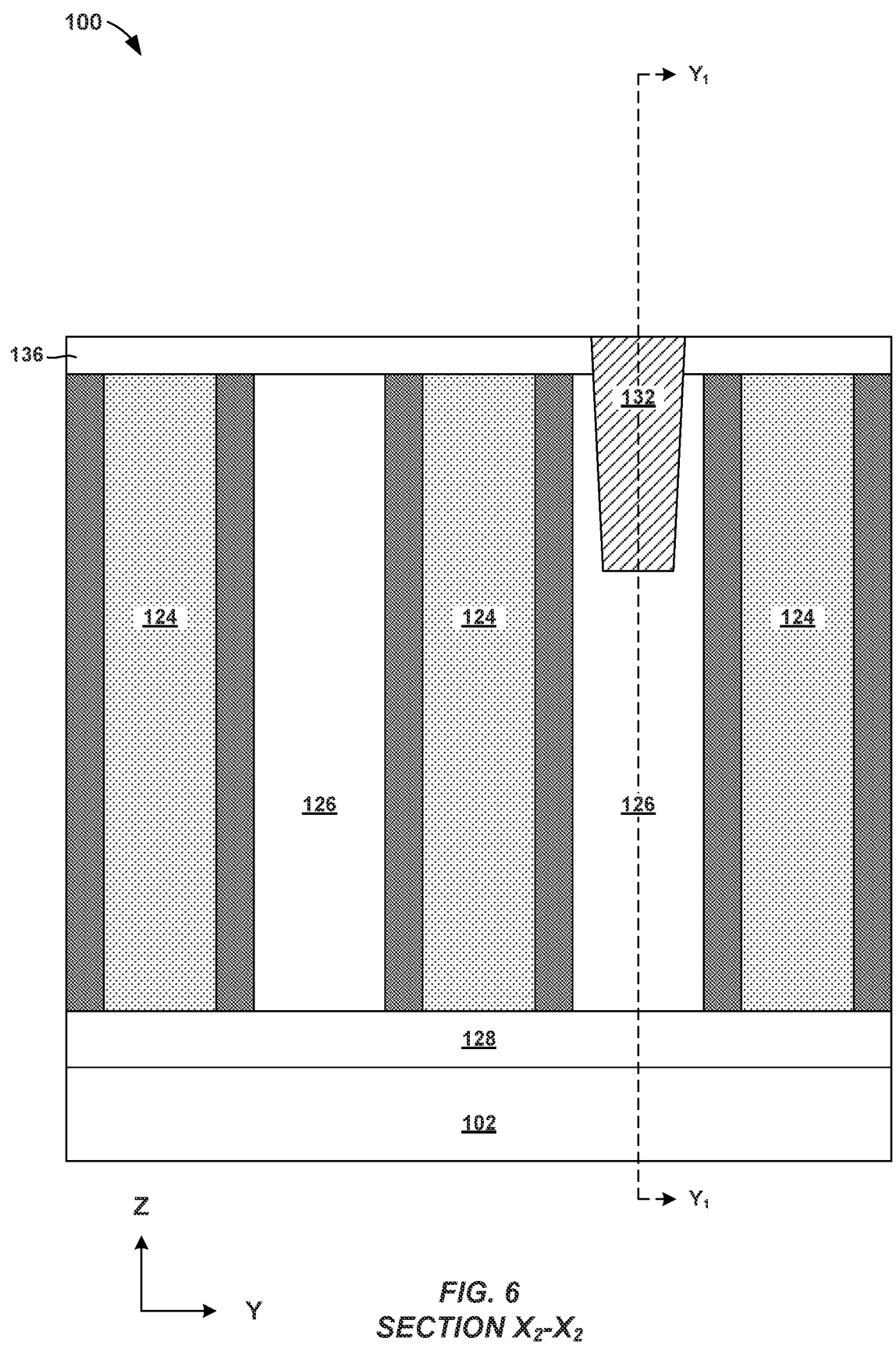
Figure 7:
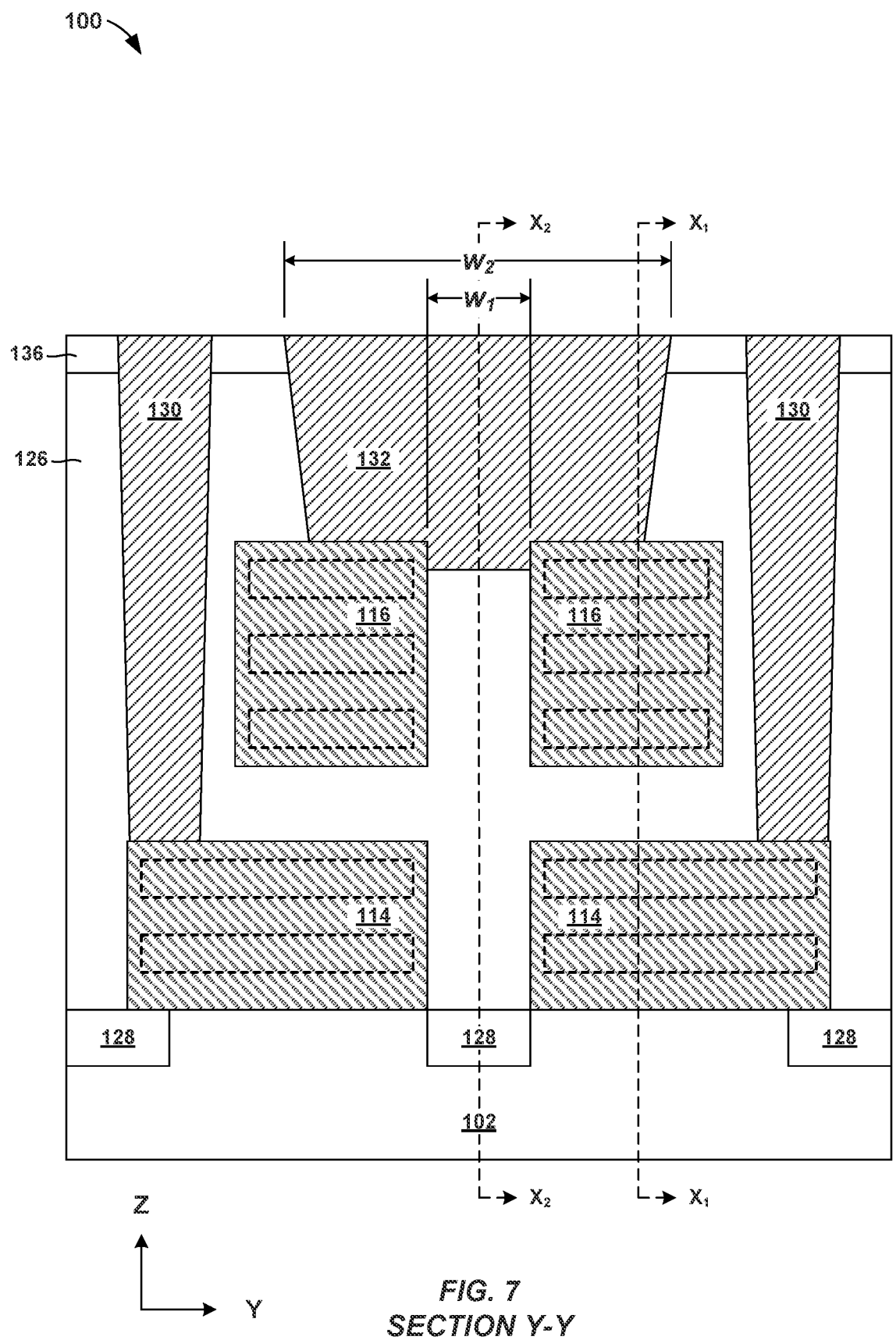

Referring now to FIGS. 5, 6, and 7, the structure 100 is shown after forming bottom source drain contacts 130 (hereinafter bottom contacts 130), top source drain contacts 132 (hereinafter top contacts 132), and gate contacts 134 in a middle-of-line dielectric layer 136 according to an embodiment of the invention. Of note, although only limited numbers of contact structures corresponding to a limited number of stacked transistors are shown in the drawings and described below, the structure 100 will inherently include multiple contact structures across the entire array of stacked transistors.

According to embodiments of the present invention the bottom contacts 130, the top contacts 132, and the gate contacts 134 are formed using typical patterning and damascene metallization techniques in which contact trenches are patterned in the middle-of-line dielectric layer 136 and the dielectric layer 126 and then subsequently filled with a conductive material. As such, the bottom contacts 130, the top contacts 132, and the gate contacts 134 will have a positive tapered profile in which a lateral width at a bottom is less than a lateral width at the top, as illustrated. After filling, excess conductive material can be polished using known techniques until a topmost surface of the bottom contacts 130, the top contacts 132, and the gate contacts 134 are flush, or substantially flush, with topmost surfaces of the middle-of-line dielectric layer 136.

Although the middle-of-line dielectric layer 136 is shown as a separate component or layer from the dielectric layer 126, they may, in some embodiments, be made from identical dielectric materials and thus be indistinguishable from one another in the final structure. In another example, the middle-of-line dielectric layer 136 and the dielectric layer 126 can be made different materials.

The contact structures (130, 132, 124) may include any suitable conductive material, such as, for example, ruthenium, tungsten, cobalt, or alloys thereof. In some embodiments, a metal silicide is formed at the bottom of the contact trenches prior to filling them with the conductive material. After filling, excess conductive material can be polished using known techniques until a topmost surface of the contact structures (130, 132, 124) are flush, or substantially flush, with topmost surfaces of the middle-of-line dielectric layer 136.

It is noted, the spacing between two adjacent stacked transistor structures, as illustrated in FIG. 7, is very tight. According to embodiments of the present invention, a distance or space ($w_1$) between the top source drain regions 116 ranges from about 20 nm to about 50 nm. As previously discussed, forming two separate individual top contacts (132), one for each transistor, is very difficult without the risk of shorting due to the small space ($w_1$) between adjacent transistors. Therefore, according to embodiments of the present invention, the top contacts 132 is formed as a single structure contacting the top source drain regions 116 of both transistors. In some contexts, the top contacts 132 may be referred to as a "merged" contact. Specifically, as illustrated in FIG. 7, the top contacts 132 is formed with a width ($w_2$) large enough to span and contact top surfaces of both top source drain regions 116 of the two adjacent structures. For example, the top contacts 132 may have a width ($w_2$) ranging from about 50 nm to about 200 nm. In most cases, the top contacts 132 will extend downward in between and contact sidewalls of the top source drain regions 116, as illustrated. Additionally, the width ($w_2$) and depth of the top contacts 132 can be tuned or adjusted to maximize the contact area between the top contacts 132 and each of the top source drain regions 116 and mitigate excess contact resistance.

Figure 8:
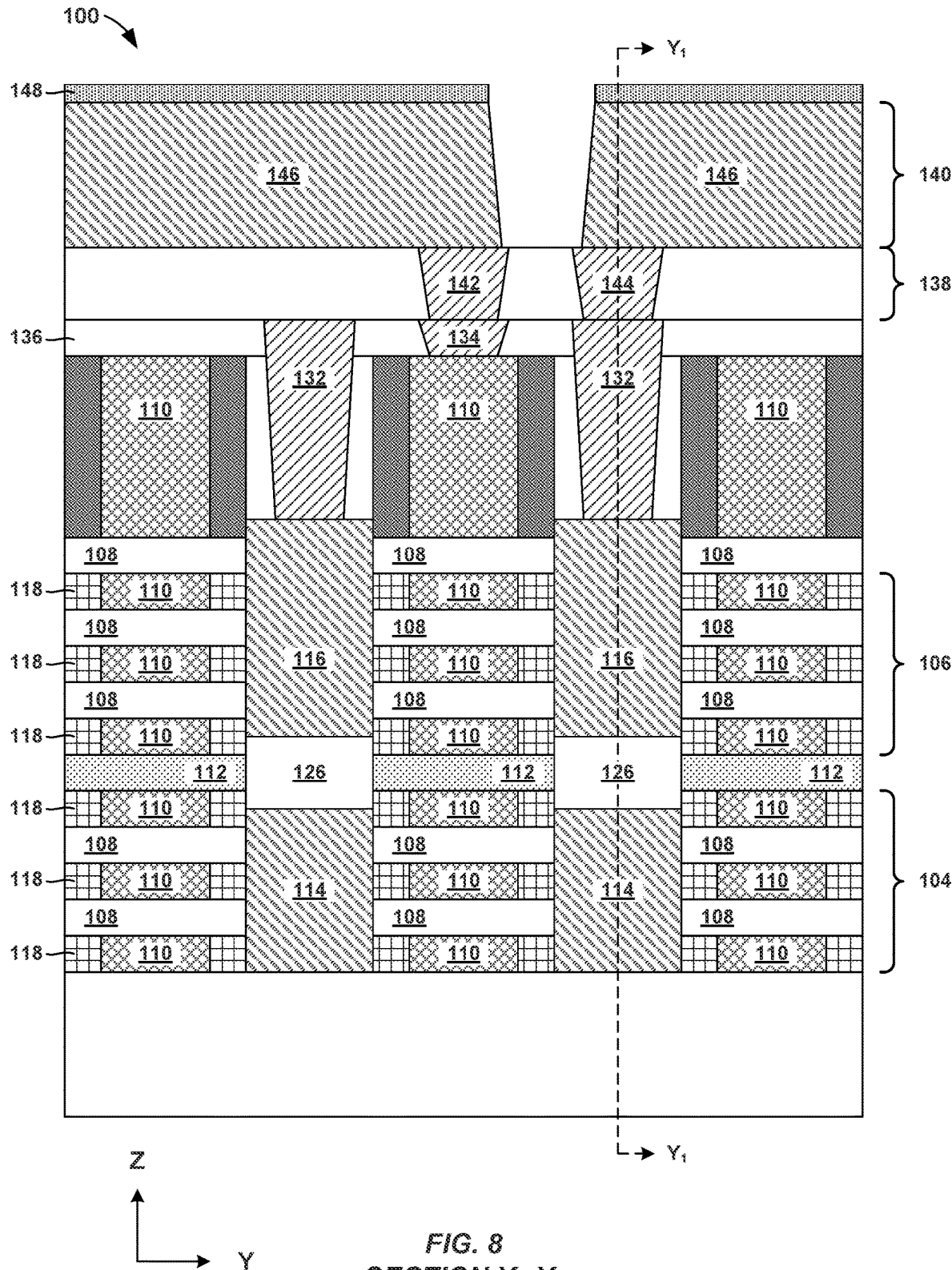
FIGS. 8, 9, and 10 are cross-sectional views of the structure after forming an intermediate via level, and a metal level according to an exemplary embodiment.
Figure 9:
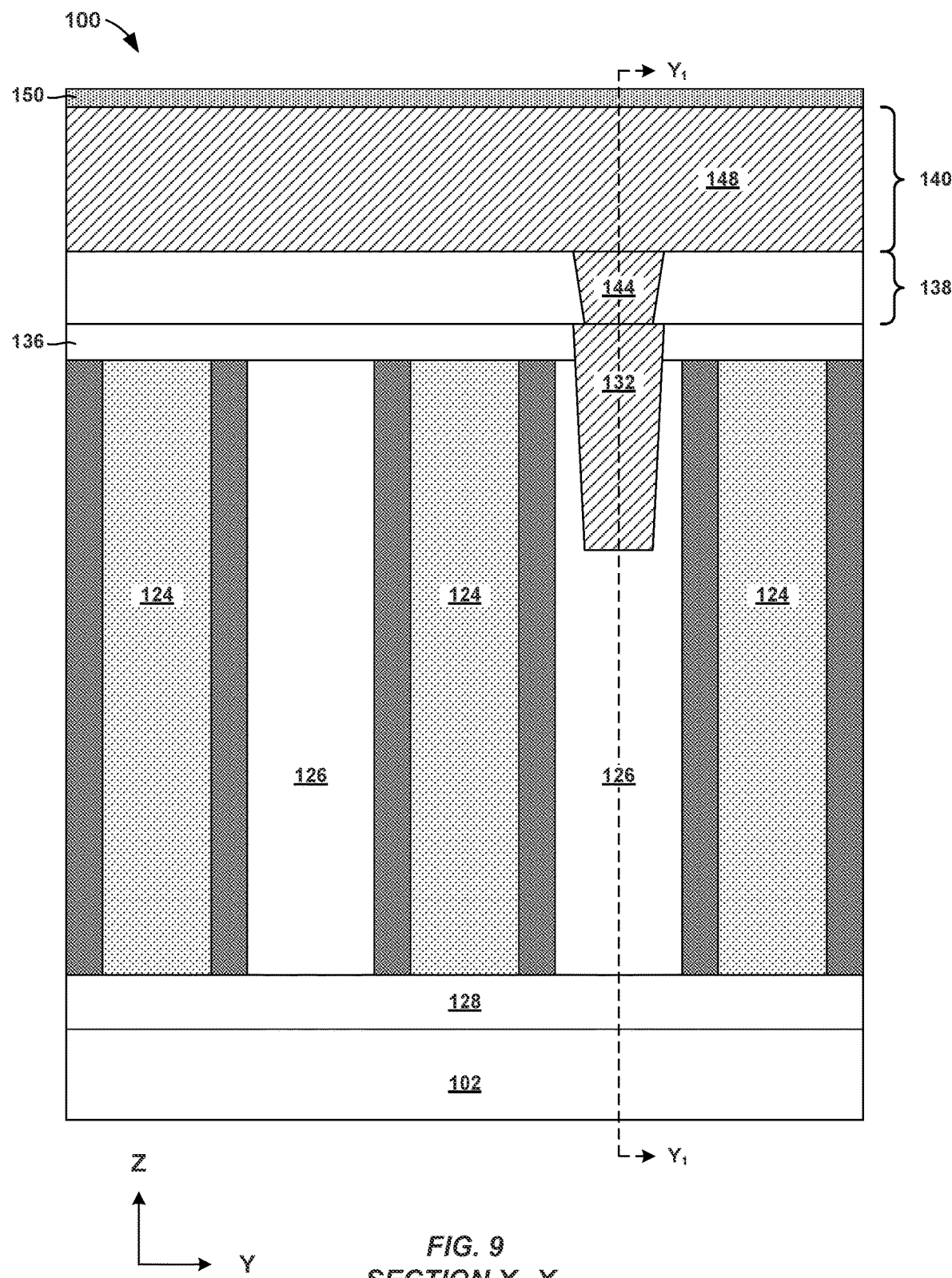
Figure 10:
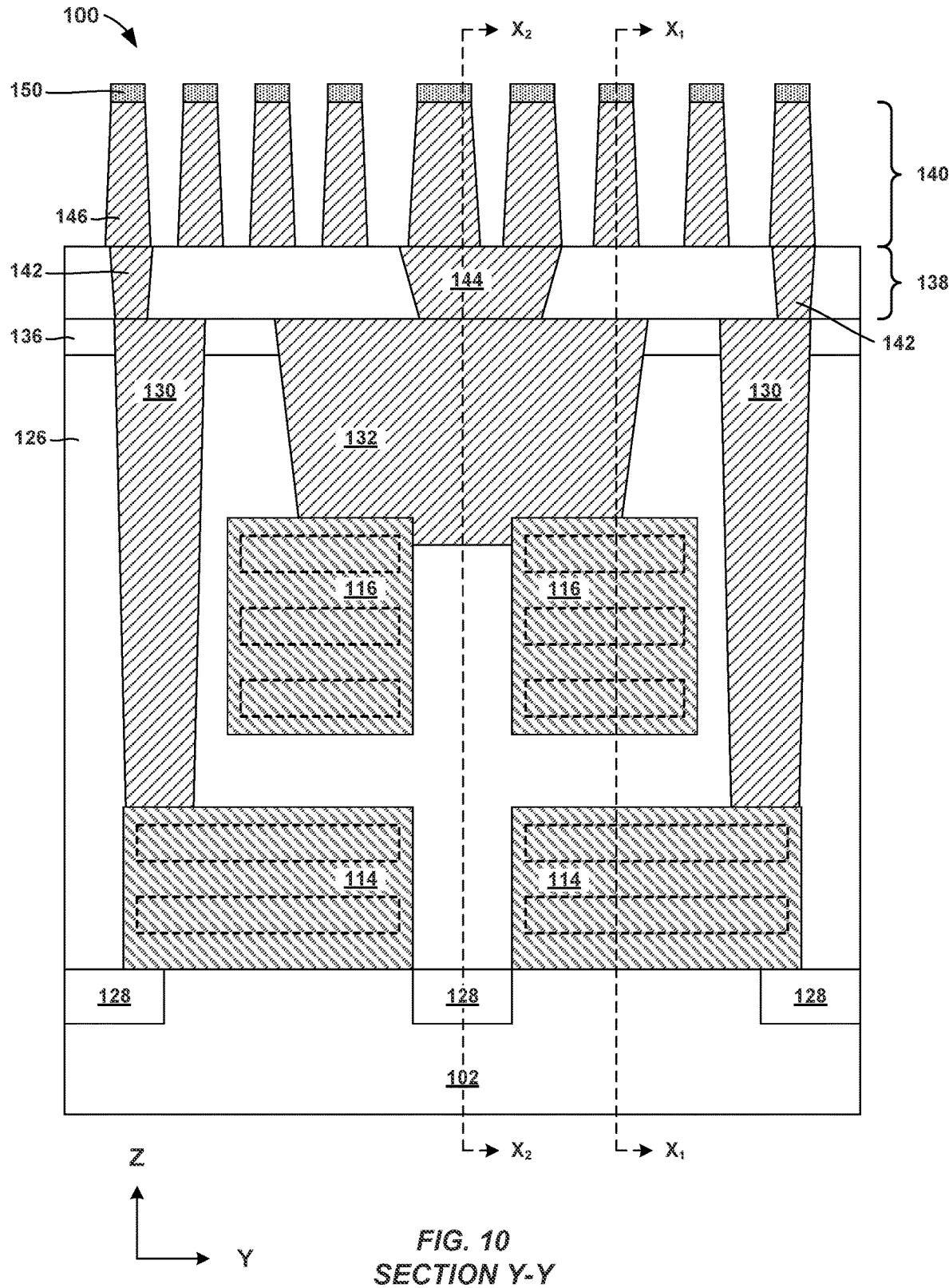

Referring now to FIGS. 8, 9, and 10, the structure 100 is shown after forming an intermediate via level 138, and a metal level 140, according to an embodiment of the invention.

The intermediate via level 138 includes a network of conductive vias 142, 144 used to form electrical connections to the bottom contacts 130, the top contacts 132, and the gate contacts 134, as illustrated. Like the contact structures (130, 132, 134) described above, the conductive vias 142, 144 of the intermediate via level 138 are also formed using typical patterning and damascene metallization techniques. Also like the contact structures (130, 132, 134), the conductive vias 142, 144 of the intermediate via level 138 will have a positive tapered profile in which a lateral width at a bottom is less than a lateral width at the top, as illustrated. Additionally, the conductive vias 142, 144 of the intermediate via level 138 may be made from the same, or similar, materials as the contact structures (130, 132, 134) described above. Like the merged contact 132 described above, it is very difficult to form two vias very close to one another without tip-to-tip short, thus, merged vias 144 are formed over the merged contacts 132.

According to embodiments of the present invention, the merged vias 144 are wider, in the y-direction, than typical interconnect structures. For example, the merged vias 144 are generally wider, in the y-direction, than the conductive vias 142, as illustrated in FIG. 10. Furthermore, it is critical to the present invention that the merged vias 144 be carefully positioned at or near a centerline between the two adjacent transistors, as illustrated in FIG. 10. The above features of the merged vias 144 enable formation of individual electrical connections for adjacent stacked transistors spaced very close to one another, as described in greater detail below.

The metal level 140, which is formed on top of the intermediate via level 138, is a typical back-end-of-line level and includes a network of conductive lines 146 to form the "wiring" or electrical connections to the underlying transistors. The conductive lines 146 may alternatively be referred to as metal lines, traces or metal traces. Unlike the contact structures (130, 132, 134) and the conductive vias 142, 144, the conductive lines 146 of the metal level 140 are not formed using typical damascene techniques. Rather, the conductive lines 146 of the metal level 140 are formed by typical subtractive etching techniques in which a conductive material is blanket deposited and subsequently patterned using a hard mask 150. As such, the conductive lines 146 of the metal level 140 will have a negative tapered profile in which a lateral width at a bottom is greater than a lateral width at the top, as illustrated. Additionally, the conductive lines 146 of the metal level 140 may be made from the same, or similar, materials as the contact structures (130, 132, 134) described above.

The pitch and position of the conductive lines 146 is specifically chosen to facilitate the embodiments disclosed herein. Specifically, for example, two conductive lines 146 are positioned directly above the merged vias 144 and the top contacts 132 such that the space between the two conductive lines 146 is positioned at or near a centerline between the two adjacent transistors, as illustrated in FIG. 10. Embodiments of the present invention cannot be realized otherwise. Finally, it is noted, the metal level 140 is initially fabricated thicker than normal in preparation for top via patterning as is described below.

Figure 11:
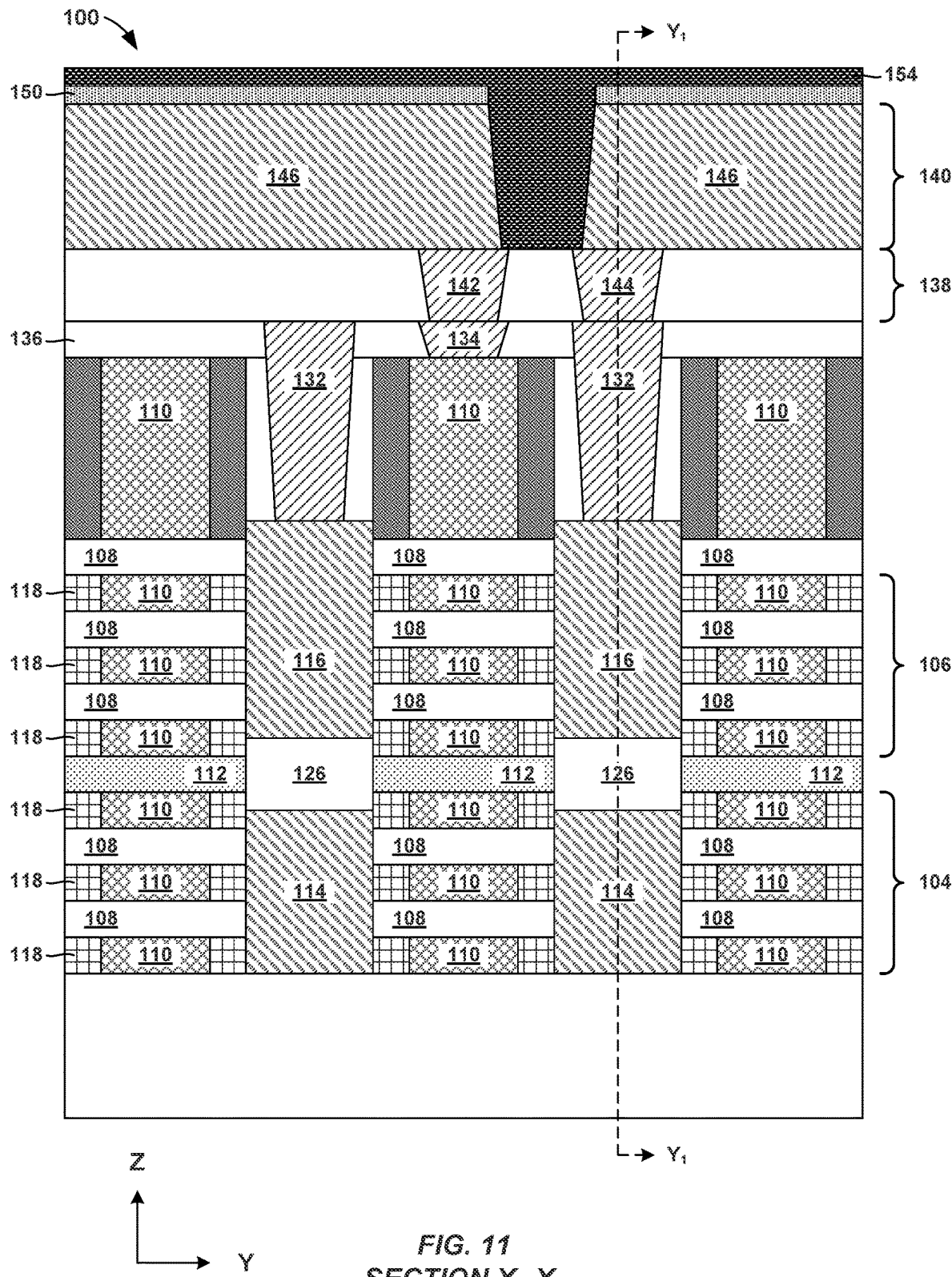
FIGS. 11, 12, and 13 are cross-sectional views of the structure after forming an isolation trench according to an exemplary embodiment.
Figure 12:
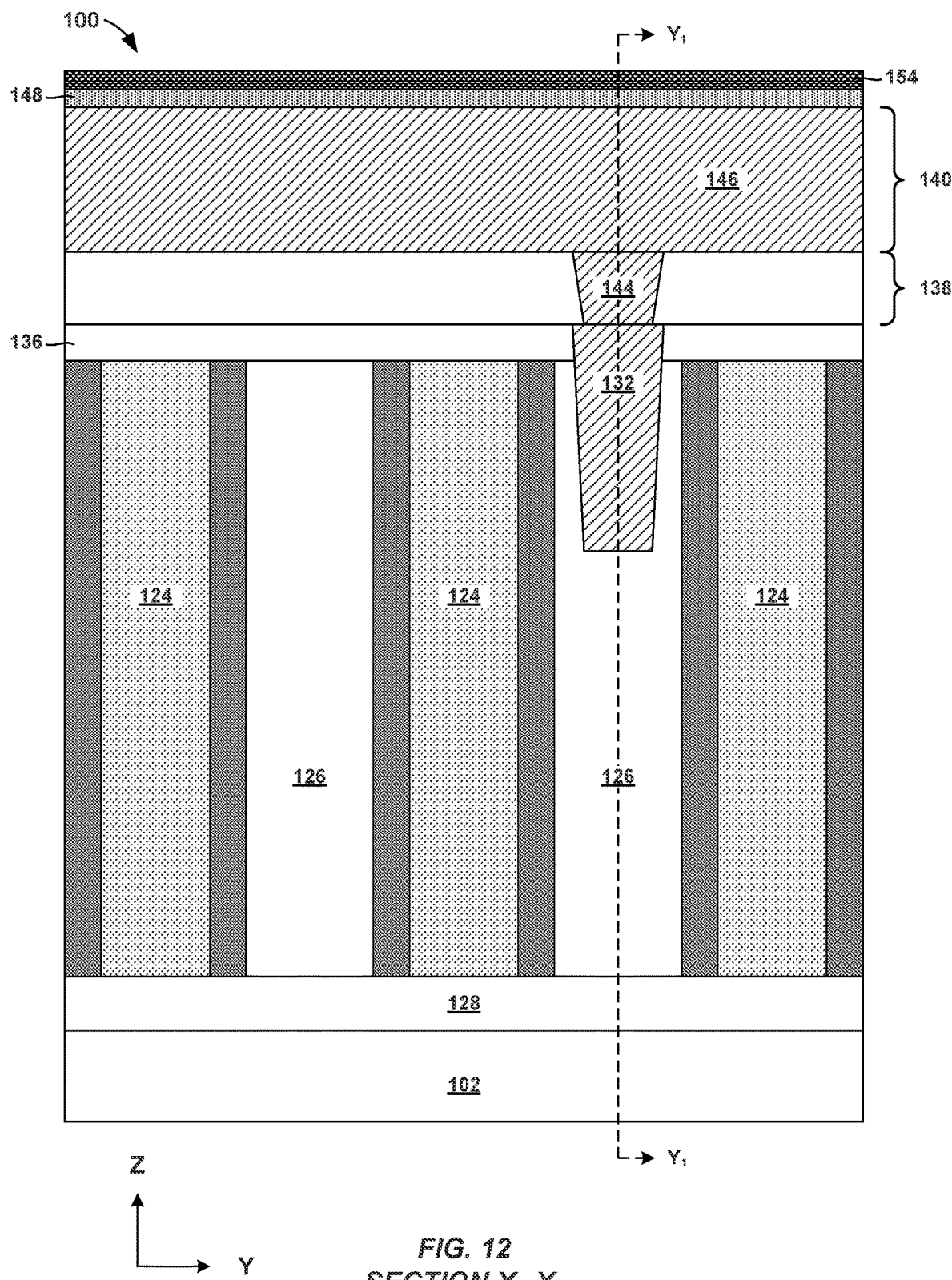
Figure 13:
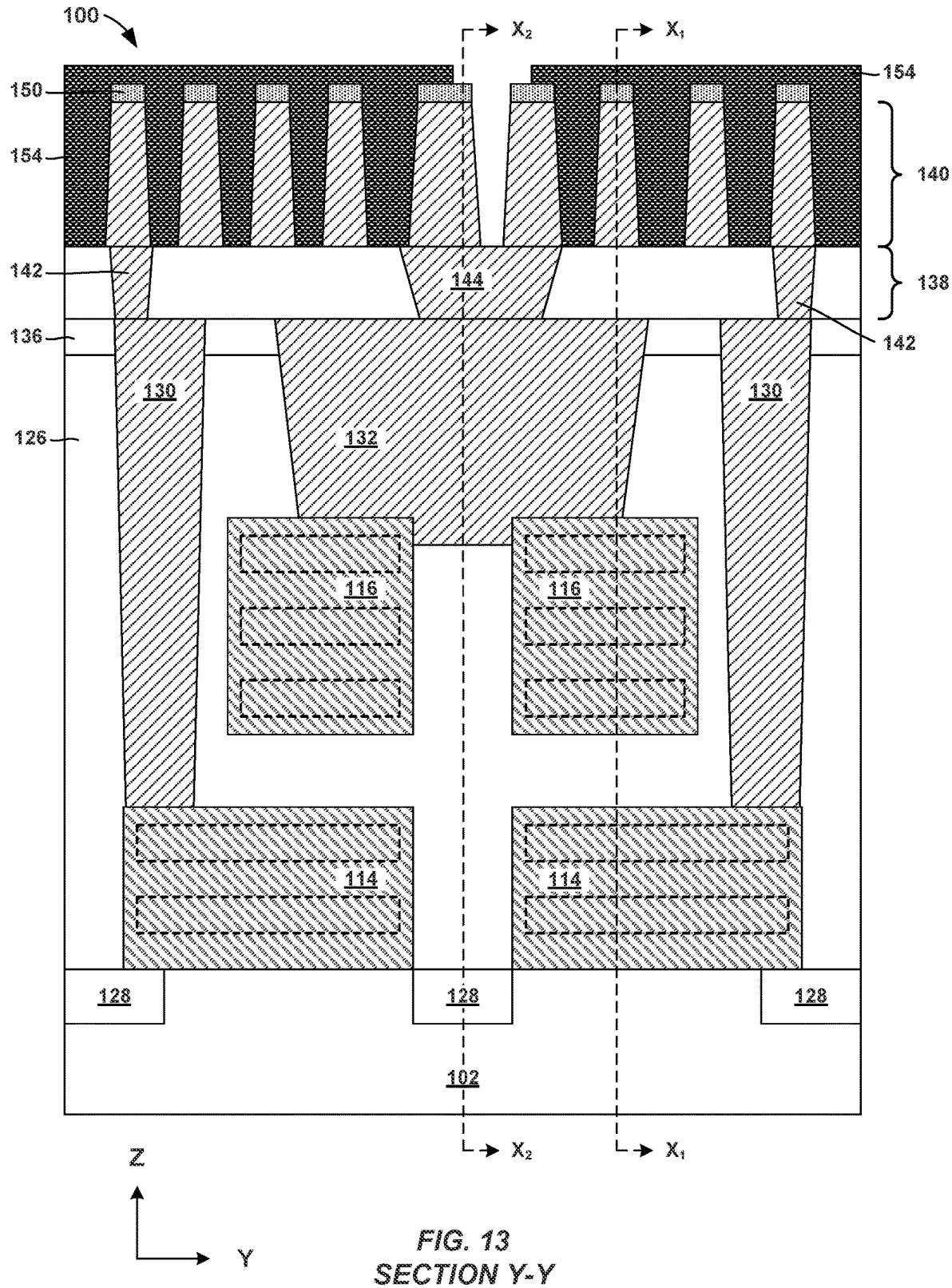

Referring now to FIGS. 11, 12, and 13, the structure 100 is shown after forming and patterning a mask 154 according to an embodiment of the invention.

The mask 154 is deposited and subsequently patterned to expose certain portions of the structure 100 according to known techniques. Specifically, a small portion of the hard mask 150 and sidewalls of the conductive lines 146 positioned directly above the top contacts 132 are exposed, as illustrated in FIG. 13.

According to an embodiment, the mask 154 can be an organic planarization layer or a layer of material that is capable of being planarized, etched, or patterned by known techniques. The mask 154 can preferably have a thickness sufficient to cover and protect existing structures during subsequent processing. After depositing the mask 154, a dry etching technique is applied to pattern the mask 154. Although general alignment of the mask 154 is important, there is some room for misalignment provided by the hard mask 150.

Figure 14:
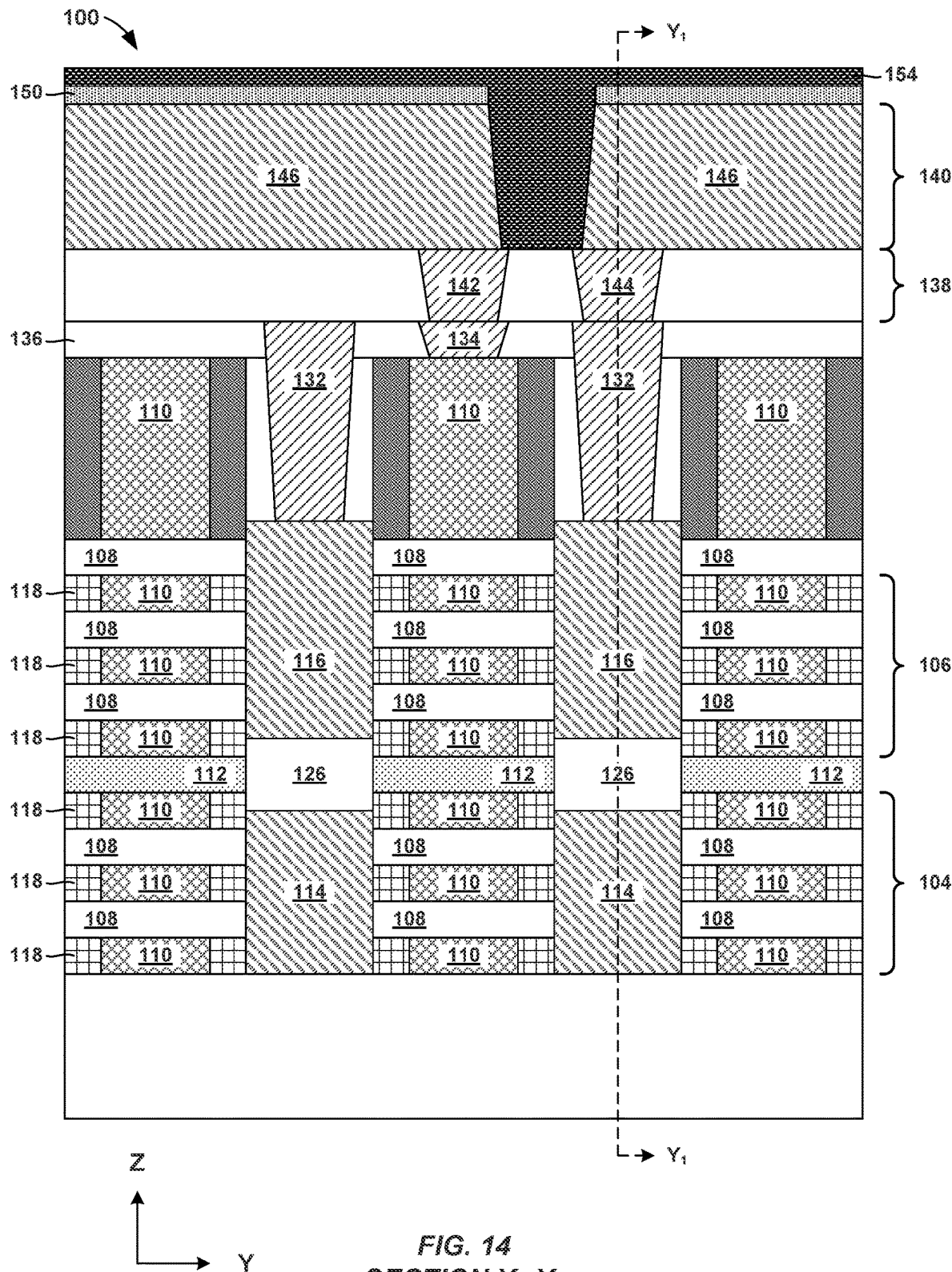
FIGS. 14, 15, and 16, are cross-sectional views of the structure after forming and patterning a mask according to an exemplary embodiment.
Figure 15:
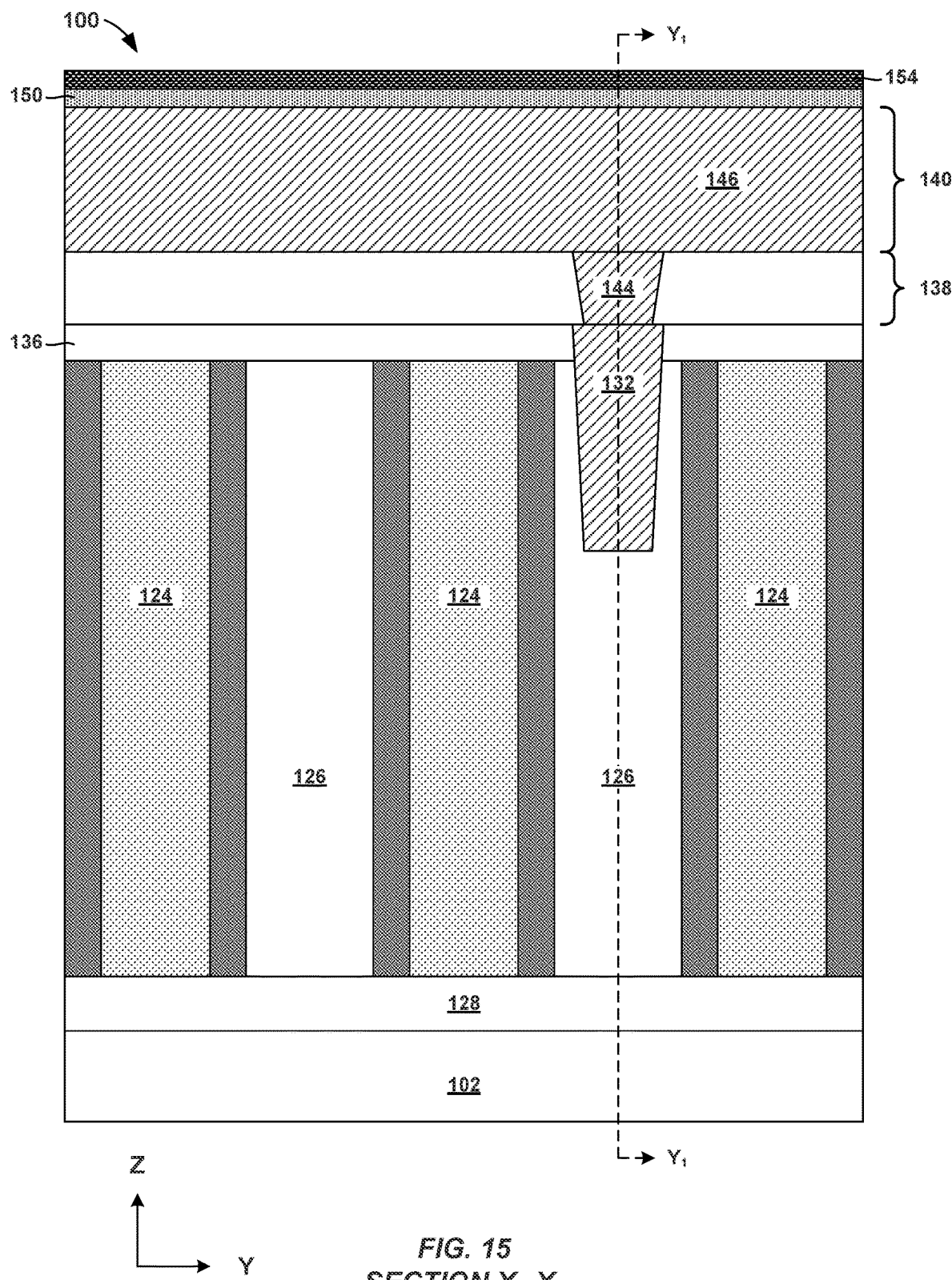
Figure 16:
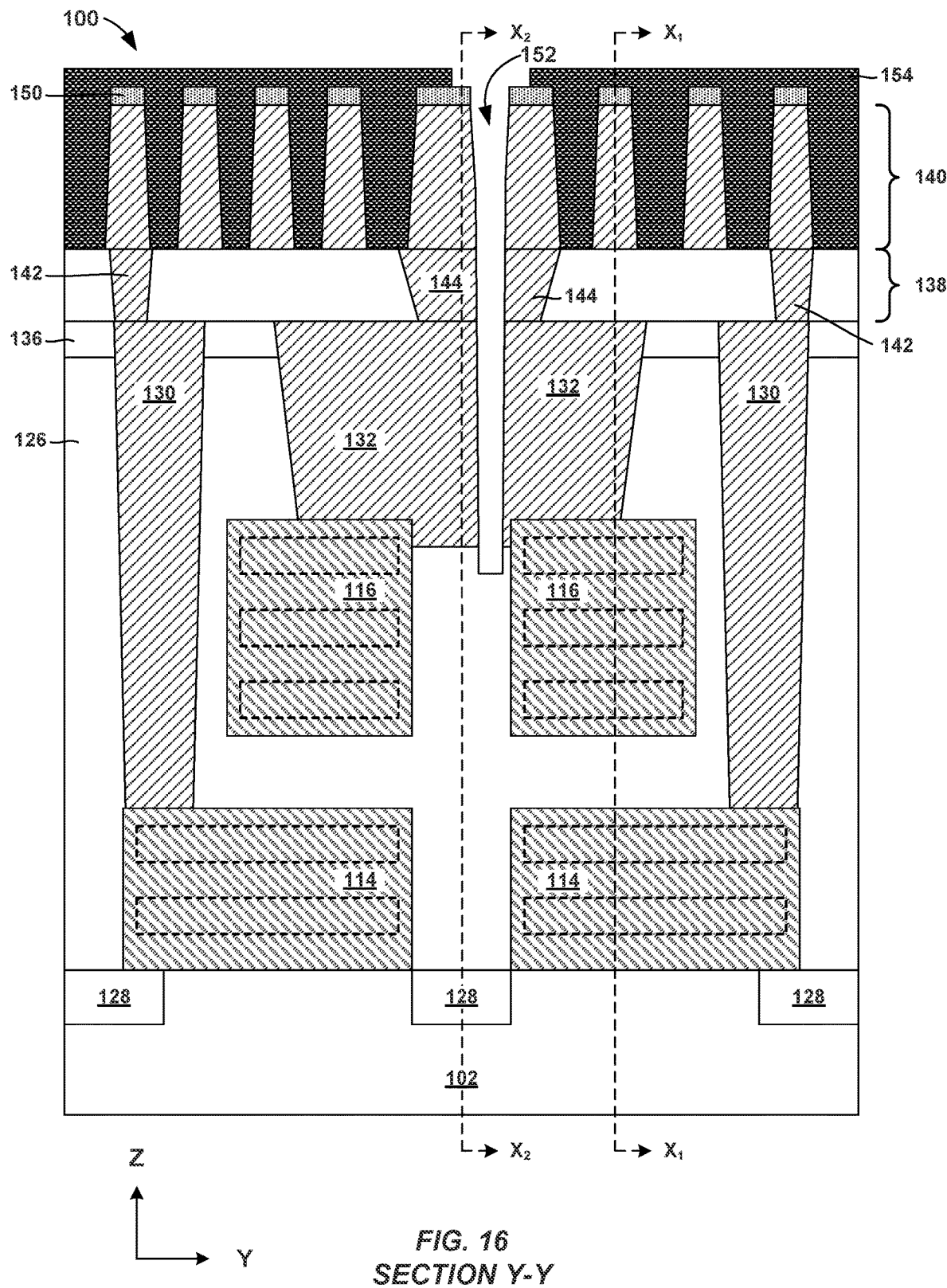

Referring now to FIGS. 14, 15, and 16, the structure 100 is shown after forming an isolation trench 152 according to an embodiment of the invention.

Known high aspect ratio etching techniques may be applied to etch sidewalls of the exposed conductive lines 146, through the conductive vias 144, and through the top contacts 132 to form the isolation trench 152. Specifically, portions of the exposed conductive lines 146, the conductive vias 144 and the top contacts 132 are removed selective to the mask 154 and the hard mask 150. As such, etching the isolation trench 152 is a self-aligned process using the existing hard mask 150. In at least an embodiment, a directional dry etch technique, such as reactive ion etching, is used to etch the metals of the exposed conductive lines 146, the conductive vias 144, and the top contacts 132 and form the isolation trench 152. Although the directional etch used to form the isolation trench 152 does not etch through the conductive lines 146 like with the conductive vias 144 and the top contacts 132, it will etch exposed sidewalls of the conductive lines 146. For example, at a minimum, the directional etching technique will etch only a lower portion of the exposed sidewalls of the conductive lines 146. Finally, after etching the isolation trench 152 the mask 154, for example the OPL, is removed by ashing.

In all cases, the isolation trench 152 extends through each of the metal level 140, the conductive vias 144, and the top contacts 132, as illustrated. As such, the isolation trench 152 will extend through multiple interconnect levels and expose the dielectric layer 126 below the top contacts 132. Furthermore, sidewalls of the conductive lines 146, the conductive vias 144, and the top contacts 132 exposed during trench formation will be flush or substantially flush with one another. Said differently, the exposed sidewalls of the conductive lines 146, the conductive vias 144, and the top contacts 132 are aligned with one another. In some embodiments, only the lower portion of the exposed sidewalls of the conductive lines 146 will be flush or substantially flush with the other sidewalls of the isolation trench 152.

Preferably, the isolation trench 152 is located between the two adjacent transistors to ensure complete separation between adjacent top contacts 132. With the addition of the isolation trench 152 each of the conductive vias 144, and the top contacts 132 are divided into two and individual electrical connections can be made to each of the adjacent top source drain regions 116. Doing so would not have been possible if the conductive vias 144 and the top contacts 132 weren't initially fabricated wider than normal.

Because the spacing between adjacent transistors, measured in the y-direction, is very tight, the aspect ratio of the isolation trench 152 must be equal to or greater than 6:1. Stated differently, the isolation trench 152 will need to be more than 6 times deeper than its width in order to (a) fit between adjacent transistors, and (b) fully extend through the metal level 140, the conductive vias 144, and the top contacts 132, as illustrated. For example, if a lateral spacing between adjacent top source drain regions 116 may be about 15 nm or less and the total combined height of the conductive lines 146, the conductive vias 144, and the top contacts 132 may be more than 90 nm, then the isolation trench 152 may be about <15 nm wide and at least 90 nm deep.

Known high aspect ratio etching techniques are highly dependent on the materials being etched. For example, high aspect ratio trenches, such as the isolation trench 152, are difficult to form in or through copper because no etch process is available to etch copper at small pitches. As such, the conductive vias 144 and the top contacts 132 of the present invention should not be made from copper. If copper is used, the isolation trench 152 may not completely divide the conductive vias 144 or the top contacts 132 thereby preventing the formation of individual top contacts.

Figure 17:
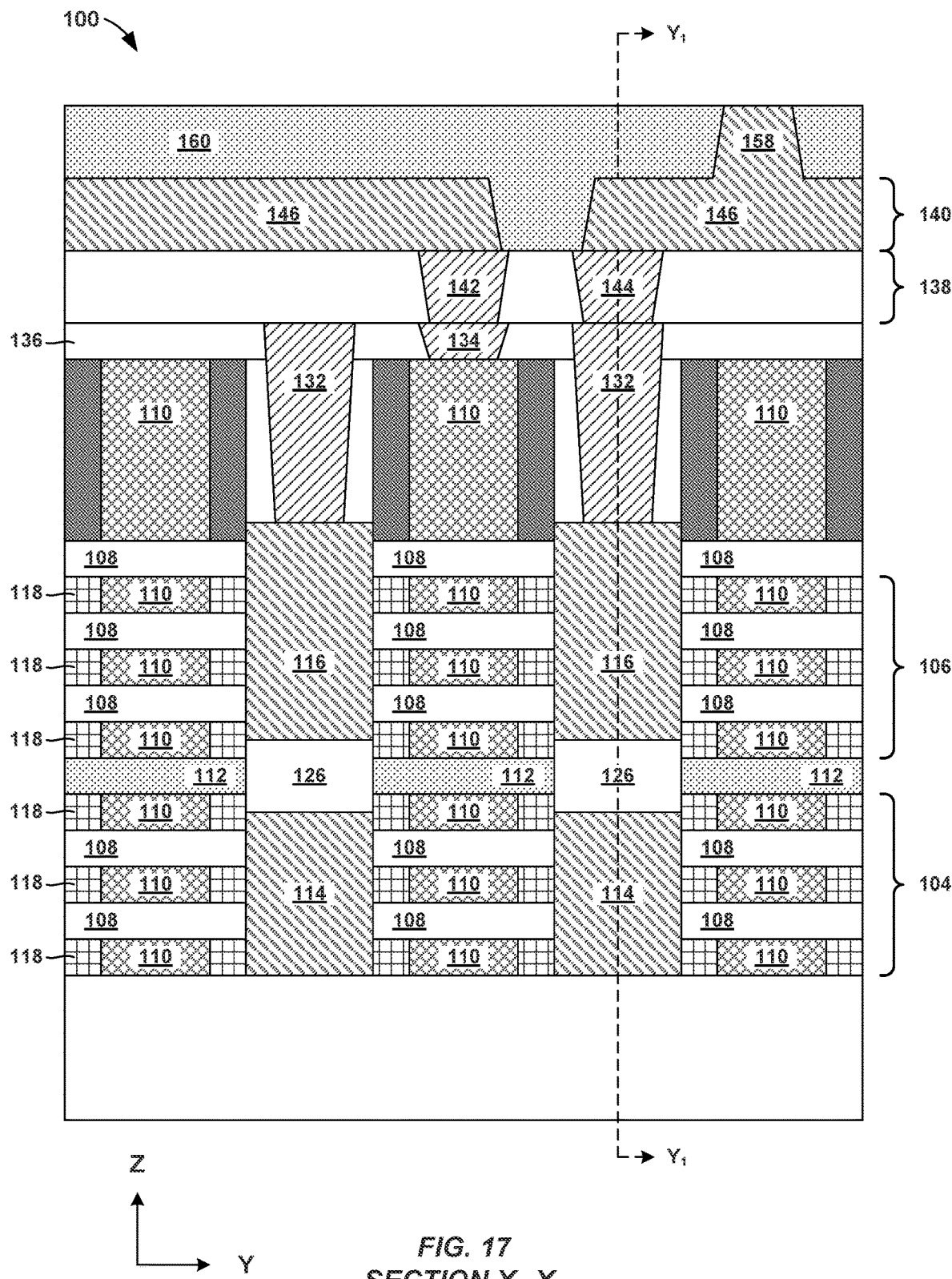
FIGS. 17, 18, and 19, are cross-sectional views of the structure after forming an isolation region and a via level according to an exemplary embodiment.
Figure 18:
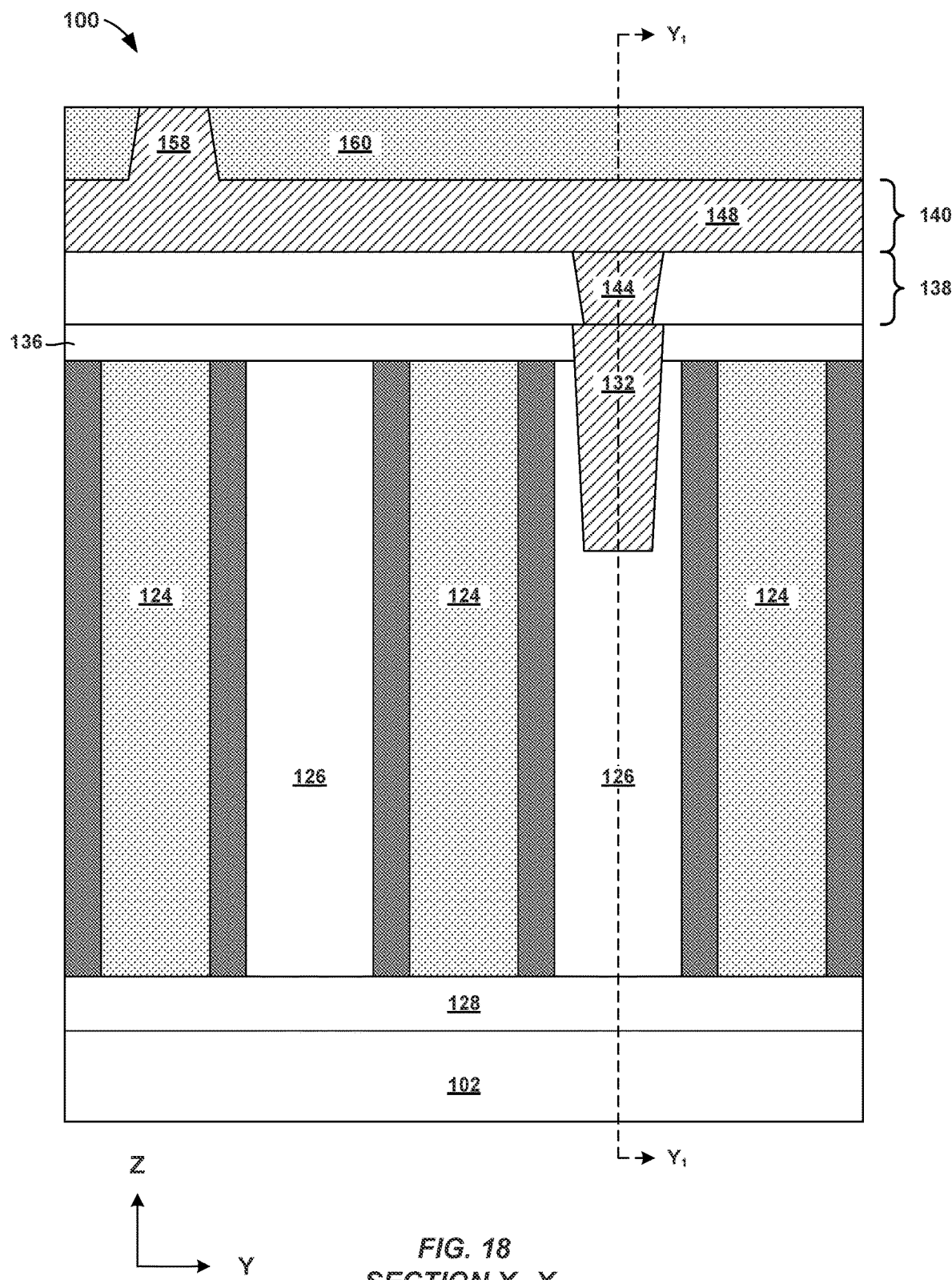
Figure 19:
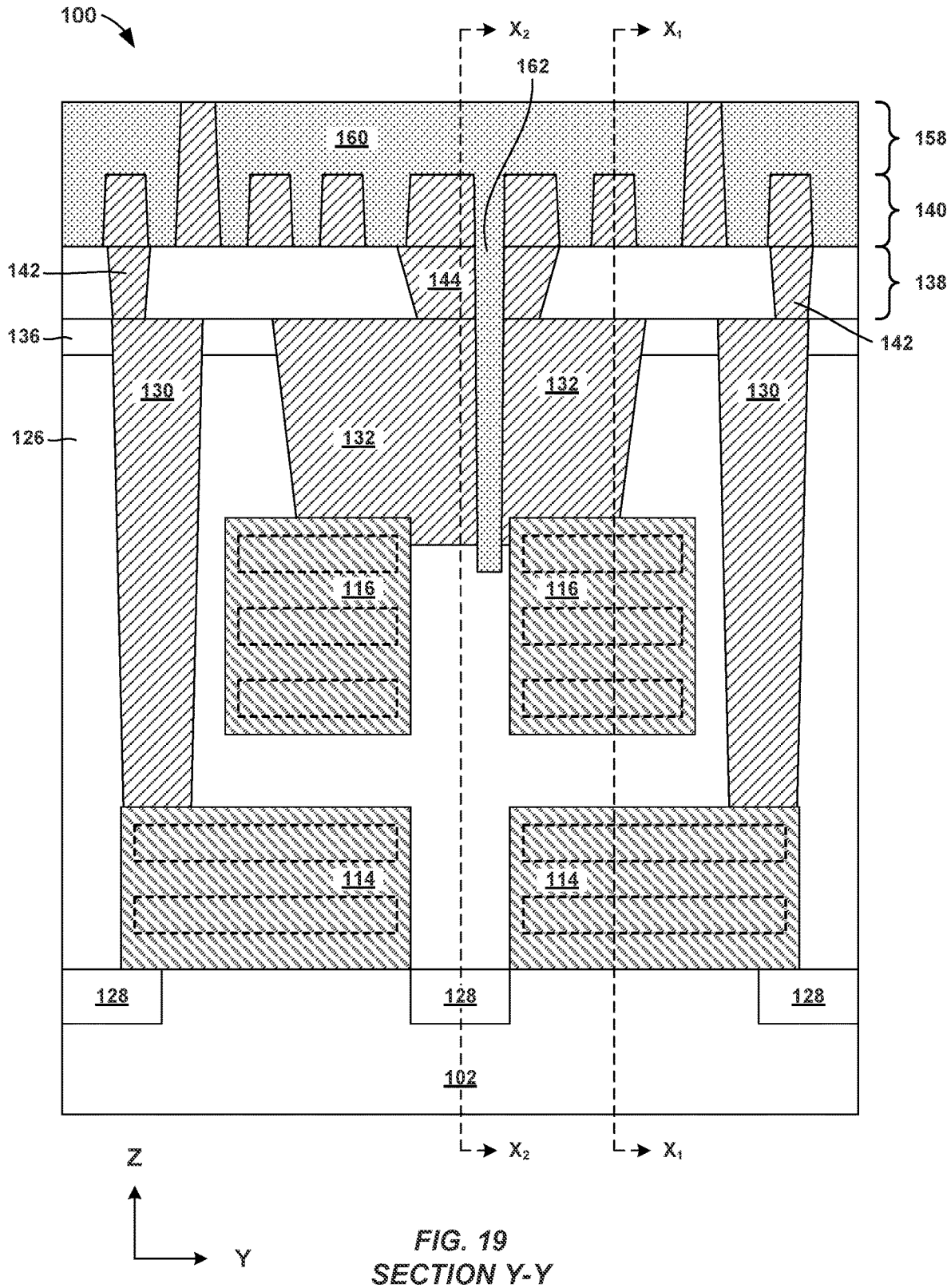

Referring now to FIGS. 17, 18, and 19, the structure 100 is shown after forming top vias 158 and an isolation region 162 according to an embodiment of the invention.

First, select portions of the metal level 140 are recessed to form the top vias 158. According to known techniques a via protection mask is applied to define the top vias 158. Because the top vias 158 are subtractively formed from existing metal structures of the metal level 140, they too will have a negative tapered profile in which a lateral width at a bottom is greater than a lateral width at the top, as illustrated. As such, the recessed portions of the metal level 140 form the conductive lines 146 of the final structure.

Finally, a dielectric fill 160 is blanket deposited across the entire structure 100. Specifically, the dielectric fill 160 fills the isolation trench 152 and substantially surrounds the existing components, for example, the conductive lines 146 and the top vias 158. The isolation trench 152 filled with the dielectric material is subsequently referred to as the isolation region 162.

In at least one embodiment, the dielectric fill 160 may include any low-k dielectric materials, such as, for example, silicon dioxide. Although the dielectric fill 160 is shown as a separate component or layer from other dielectrics, they may, in some embodiments, be made from identical dielectric materials and thus be indistinguishable from one another in the final structure. Alternatively, the dielectric fill 160 can be made different dielectric materials from the other dielectrics previously described above. After, excess dielectric fill material can be polished using known techniques until a topmost surface of the dielectric fill 160 is flush, or substantially flush, with topmost surfaces of the top vias 158.

In a primary embodiment, the isolation trench 152 is completely filled with the dielectric fill 160. The isolation region 162 electrically isolates the corresponding electrical connections to the top source drain regions 116 of the adjacent transistors, as illustrated in FIG. 19.

Figure 20:
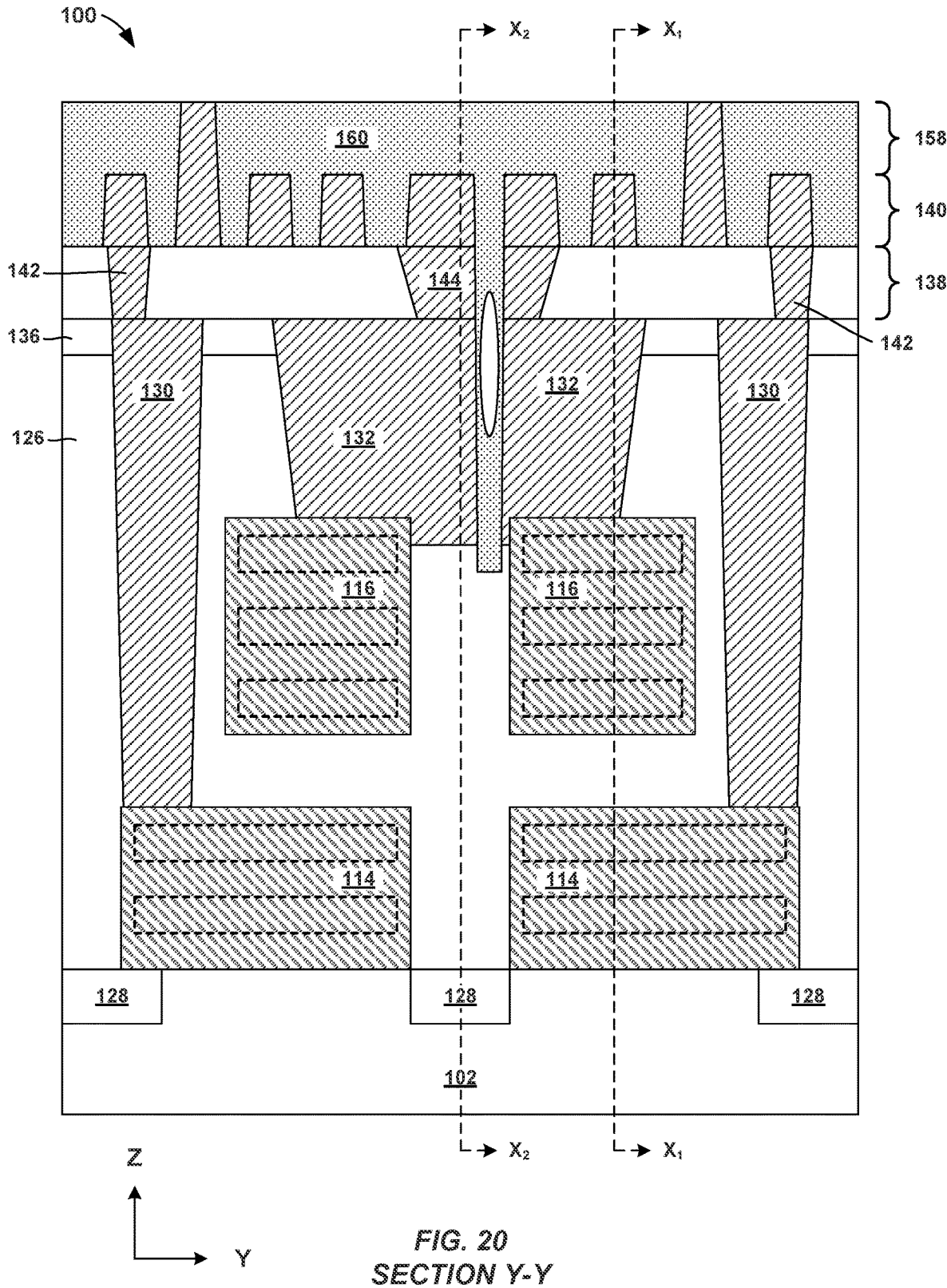
FIGS. 20 and 21 are cross-sectional views of the structure according to an alternative exemplary embodiment.
Figure 21:
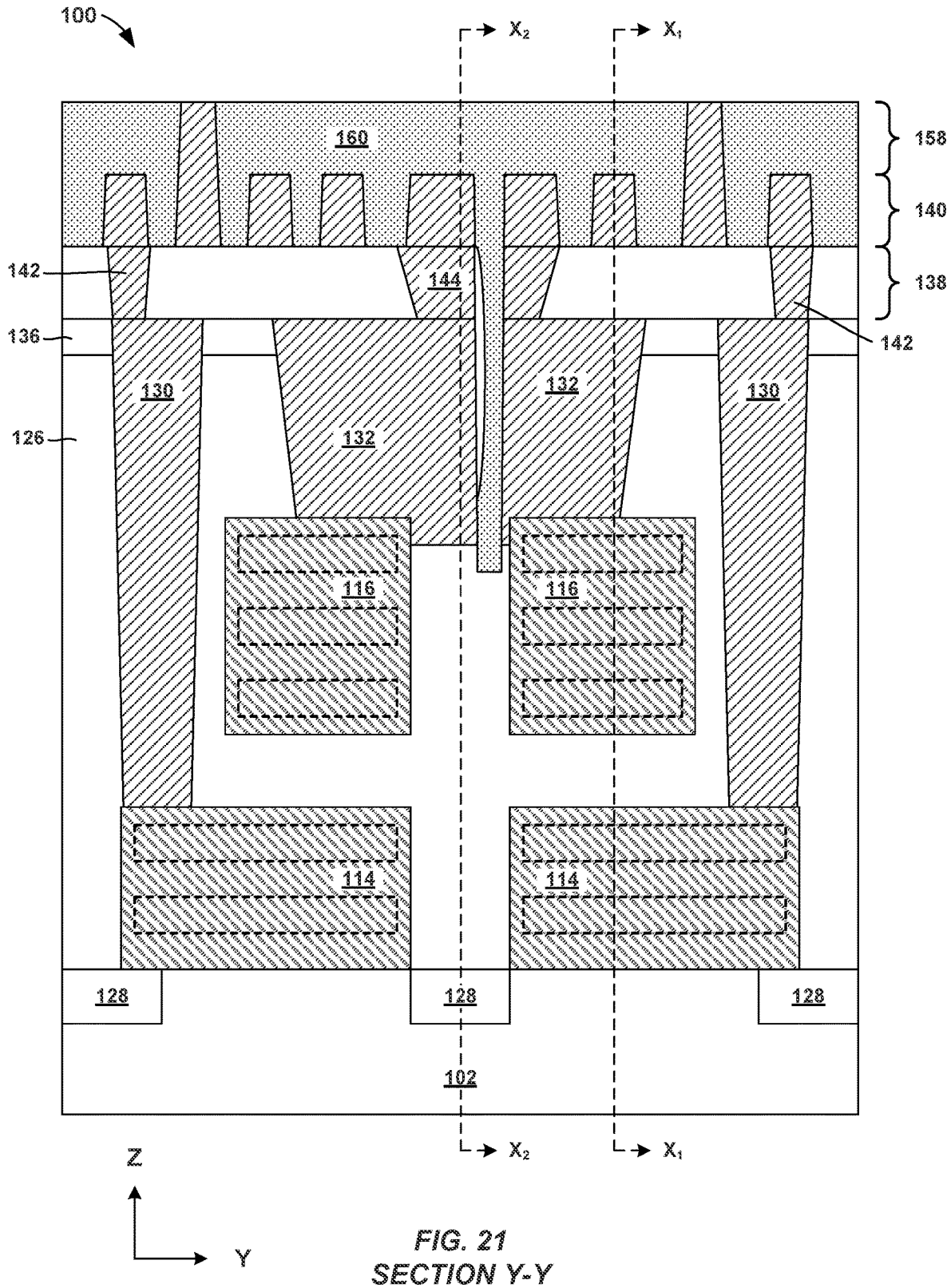

In some cases, filling the high aspect ratio isolation trench 152 can present its own challenges, for example, partial or incomplete filling. As such, embodiments of the present invention explicitly contemplate partial or incomplete filling of the isolation trench 152. Despite the known process complications with completely filling the isolation trench 152, a partial or incomplete filling presents certain advantages. For example, air gaps, as illustrated in FIGS. 20 and 21, formed by the partial or incomplete filling of the isolation trench 152, may lower parasitic capacitance between adjacent contact structures. In such cases, the air gap(s) would be embedded within the isolation region 156. The air gaps illustrated in FIGS. 20 and 21 are examples only, and do not represent the exact size, shape, or location of the air gaps created by partially filling a high aspect ratio trench.

In sum, for purposes of this description the structure 100 illustrated in the figures and described herein includes multiple stacked transistor structures positioned adjacent, or next, to one another, and manufactured in a process flow. Embodiments of the present invention, and the detailed description provided herein, are directed at forming individual top contacts (132) and corresponding back-end-of-line connections for adjacent stacked transistors spaced very close to one another. Further, each stacked transistor structure includes a top device and a bottom device. More specifically, both top devices and bottom devices of each stacked transistor structure have a nanosheet, or gate-all-around, structure.

As previously noted, forming individual top contacts 132 is very difficult when transistors, specifically the top source drain regions 116, are arranged very close to one another. Therefore, according to embodiments of the present invention, larger metal structures (132, 144) are formed and subsequently split or divided into two individual conductive paths by the self-aligned process described above. As such, embodiments of the present invention enable wiring each transistor individually, separate and apart, from one another without the risk of shorting cause by misalignment due to known process variation.

As illustrated in FIGS. 17, 18, and 19, the stacked transistor structure represented by the structure 100 has some distinctive notable features. The isolation region 162 a homogeneous high aspect ratio dielectric structure which extends through three metal structures, specifically the top source drain contacts 132, the conductive vias 144, and the conductive lines 146. Doing so is only possible by first forming the metal structures (132, 144, 146) and then subsequently forming the isolation region 162 through between the lines (146) and through the merged metal structures (132, 144), as described in detail above. The isolation region 162 may alternatively be referred to as an isolation pillar or an isolation column, that divides two metal structures (132, 144) arranged vertically above each other into multiple components/elements/contacts.

Unlike conventional metal structures fabricated individually using conventional techniques, the isolation region 162 of the present invention shares sidewalls with the metals (132, 144, 148). More specifically, a vertical surface (ie sidewall) of the isolation region 162 is substantially flush with vertical surfaces (ie sidewalls) of the metals (132, 144, 148), as illustrated in FIG. 19. Even more specifically, a vertical surface of the top contacts 132 is substantially flush with a vertical surface of the isolation region 162, a vertical surface of the conductive vias 144 is substantially flush with a vertical surface of the isolation region 162, and a vertical surface of the conductive lines 146 is substantially flush with a vertical surface of the isolation region 162, also as illustrated in FIG. 19, and further described above.

For reference purposes measurements taken in the x-direction, perpendicular to the gate 110, are herein referred to as "length", while measurements taken in the y-direction, parallel to the gate 110, are herein referred to as "width".

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
a dielectric isolation region between and electrical isolating a first top contact of a first stacked transistor from a second top contact of a second stacked transistor, wherein the dielectric isolation region comprises a high aspect ratio and extends through two metal levels above the first and second top contacts,
wherein at least one vertical surface of the first top contact is substantially flush with at least one vertical surface of the dielectric isolation region, and
wherein at least one vertical surface of the second top contact is substantially flush with the at least one vertical surface of the dielectric isolation region.

2. The semiconductor structure according to claim 1, wherein the first top contact and the second top contact together have a positive tapered profile.

3. The semiconductor structure according to claim 1,
wherein the first top contact of the first stacked transistor directly contacts both a top and a sidewall of a first top source drain region;
wherein the second top contact of the second stacked transistor directly contacts both a top and a sidewall of a second top source drain region.

4. The semiconductor structure according to claim 1, further comprising:
an air gap embedded within the dielectric isolation region.

5. A semiconductor structure comprising:
- a dielectric isolation region between and electrical isolating a first top contact of a first stacked transistor from a second top contact of a second stacked transistor;
- a first via above and contacting the first top contact, wherein a vertical surface of the first top contact is substantially flush with a vertical surface of the first via; and
- a second via above and contacting the second top contact, wherein a vertical surface of the second top contact is substantially flush with a vertical surface of the second via.

6. The semiconductor structure according to claim 5, further comprising:
- a first metal trace above and contacting the first via, wherein the vertical surface of the first via is substantially flush with a vertical surface of the first metal trace; and
- a second metal trace above and contacting the second via, wherein the vertical surface of the second via is substantially flush with a vertical surface of the second metal trace.

7. The semiconductor structure according to claim 6, wherein the first metal trace and the second metal trace together have a negative tapered profile.

8. The semiconductor structure according to claim 5,
- wherein the vertical surface of the first top contact is substantially flush with a vertical surface of the dielectric isolation region, and
- wherein at least one vertical surface of the second top contact is substantially flush with at least one vertical surface of the dielectric isolation region.

9. The semiconductor structure according to claim 5, wherein the dielectric isolation region comprises a high aspect ratio and extends through two metal levels above the first and second top contacts.

10. The semiconductor structure according to claim 5, wherein the first top contact and the second top contact together have a positive tapered profile, and wherein the first via and the second via together have a positive tapered profile.

11. The semiconductor structure according to claim 5,
- wherein the first top contact of the first stacked transistor directly contacts both a top and a sidewall of a first top source drain region;
- wherein the second top contact of the second stacked transistor directly contacts both a top and a sidewall of a second top source drain region.

12. The semiconductor structure according to claim 5, further comprising:
- an air gap embedded within the dielectric isolation region.

13. A semiconductor structure comprising:
- a via above and contacting a top contact of a stacked transistor, wherein a sidewall of the via is substantially flush with a sidewall of the top contact; and
- a dielectric isolation region adjacent to and contacting the top contact and the via, wherein a sidewall of the dielectric isolation region is substantially flush with the sidewall of the via and the sidewall of the top contact.

14. The semiconductor structure according to claim 13, further comprising:
- a metal line above and contacting the via, wherein the sidewall of the via is substantially flush with a sidewall of the metal line.

15. The semiconductor structure according to claim 13, wherein the sidewall of the top contact is substantially flush with the sidewall the dielectric isolation region.

16. The semiconductor structure according to claim 13, wherein the dielectric isolation region comprises a high aspect ratio and extends through two metal levels above the top contact.

17. The semiconductor structure according to claim 13, wherein the top contact together have a positive tapered profile, and wherein the first via and the second via together have a positive tapered profile.

18. The semiconductor structure according to claim 13, wherein the top contact directly contacts both a top and a sidewall of a top source drain region.

19. The semiconductor structure according to claim 13, further comprising:
- an air gap embedded within the dielectric isolation region.

* * * * *